United States Patent [19]
Pinkham

[11] Patent Number: 5,528,551
[45] Date of Patent: Jun. 18, 1996

[54] READ/WRITE MEMORY WITH PLURAL MEMORY CELL WRITE CAPABILITY AT A SELECTED ROW ADDRESS

[76] Inventor: Raymond Pinkham, 2023 Retriever La., Missouri City, Tex. 77489

[21] Appl. No.: 291,383

[22] Filed: Aug. 16, 1994

Related U.S. Application Data

[62] Division of Ser. No. 535,243, Jun. 6, 1990, abandoned, which is a continuation of Ser. No. 80,634, Aug. 26, 1987, abandoned, which is a continuation-in-part of Ser. No. 53,200, May 21, 1987, Pat. No. 4,817,058.

[51] Int. Cl.$^6$ .................................................. G11C 7/00
[52] U.S. Cl. .................... 365/230.06; 365/189.02; 365/230.03; 365/220; 365/221
[58] Field of Search ................ 365/189.02, 189.05, 365/230.01, 230.03, 230.06, 230.08, 238.5, 220, 221; 395/400, 425

[56] References Cited

U.S. PATENT DOCUMENTS

| | | | |
|---|---|---|---|
| 3,354,440 | 11/1967 | Farber et al. | 365/154 |
| 3,548,386 | 12/1970 | Bidwell et al. | 365/49 |
| 3,609,702 | 9/1971 | Gardner | 365/49 |
| 4,660,181 | 4/1987 | Saito et al. | 365/238.5 |
| 4,667,313 | 5/1987 | Pinkham et al. | 365/189.03 |
| 4,750,839 | 6/1988 | Wang et al. | 365/238.5 |
| 4,788,668 | 11/1988 | Okada | 365/150 |
| 4,809,225 | 2/1989 | Dimmler et al. | 365/149 |
| 4,833,650 | 5/1989 | Hirayama et al. | 365/238.5 |
| 4,858,180 | 8/1989 | Murdoch | 365/49 |
| 4,930,104 | 5/1990 | Nakagawa et al. | 365/49 |
| 4,933,900 | 6/1990 | Yamaguchi et al. | 365/189.03 |

FOREIGN PATENT DOCUMENTS

| | | |
|---|---|---|
| 61-288240 | 12/1986 | Japan . |
| 62-279596 | 12/1987 | Japan . |
| 822290 | 4/1981 | U.S.S.R. . |

*Primary Examiner*—Jack A. Lane

[57] ABSTRACT

A read/write memory for use with a central processing unit is disclosed, which has the capability of writing the same data state to multiple memory cells in a selected row in a single cycle. The invention is incorporated into the memory by a capacitor which is selectively connected to one of the bit lines received by each sense amplifier to override the sensing operation, thereby setting the polarity of the sensed differential voltage to a predetermined state. The restoring operation of the sense amplifier restores the sensed data state into the selected memory cell, completing the write. In response to a control signal generated in the read/write memory, the capacitor is connectable to multiple bit lines, for efficiency of design. Each capacitor has sufficient capacitance to fully discharge a stored "1" value plus the dummy capacitor charge, for each of the bit lines to which it will be connected. Logic is incorporated into the memory to receive the data state to be written, and to receive the least significant bit of the row address. The logic connects the capacitor to the bit line to which the storage cell is connected in order to write a "0" state (the capacitor being precharged to ground), and connects the capacitor to the bit line to which the dummy cell is connected in order to write a "1" state. For a multiple input/output memory, a write mask may be included to inhibit the writing by the capacitor for selected arrays of the memory. A data input register may also be provided for storing the data to be written for multiple write cycles.

7 Claims, 12 Drawing Sheets

READ/WRITE MEMORY WITH PLURAL MEMORY CELL WRITE CAPABILITY AT A SELECTED ROW ADDRESS

This is a division of application Ser. No. 07/535,243, filed 06/06/90, now abandoned, which is a continuation of Ser. No. 07/089,634, filed Aug. 26, 1987, now abandoned, which is a continuation in part of Ser. No. 07/053,200, filed May 21, 1987, now U.S. Pat. No. 4,817,058.

This application is a continuation-in-part of my prior copending application Ser. No. 053,200 (TI-I2073), filed on May 21, 1987 and assigned to Texas Instruments Incorporated.

This application is related to prior copending applications Ser. No. 081,926 (TI-12074), and Ser. No. 081,948 (TI-12921), both filed Aug. 5, 1987 and assigned to Texas Instruments Incorporated.

The subject invention is in the field of memory devices, specifically dual-port random access semiconductor memory devices as used in graphics applications.

BACKGROUND OF THE INVENTION

With the advent of less expensive semiconductor memory, modern computer and microcomputer systems have been able to use bit-mapped video displays for the output of data from the system. As is well known, a bit-mapped video display requires a memory bit-mapped which can store at least one binary digit (bit) of information for each picture element (pixel) of the display device. Additional bits stored for each pixel provide the capability of the system to render complex images on the video display, such as multi-color images, and background and foreground images, such as a graphics background with textual information overlaid thereupon. The use of bit-mapped memory for storing image information also allows for data processing operations to easily generate and modify the stored image.

Modern video display devices are often of the raster-scan type, where an electron gun traces horizontal lines across the display screen in order to generate the desired image. In order for a raster scan image to continue to be displayed on the video screen, the image must be refreshed during periodic intervals. A common refresh interval for the cathode ray tube video display devices is 1/60 of a second, since the refresh operation carried out during that length interval is not noticable to the human user of the system. However, as the number of pixels displayed on a screen increases, in order to increase the resolution of the displayed image, more and more bits of information must be accessed from the bit-mapped memory during the refresh interval. If the bit-mapped memory has but a single input and output port, the percentage of time during which the data processing unit can access the bit-mapped memory varies inversely with the number of bits per pixel for the display so long as the refresh interval remains constant. In addition, the speed of the memory must increase with the number of bits per pixel, since more bits must be output during a fixed period of time.

Multiport random access memories have been developed which provide for high-speed output of data to the video display and also for increased accessibility of the memory contents to the data processing device. The multiport memories accomplish this by having a first port for random access and update of the memory by the data processing unit of the computer system and a second port for serial output of the memory contents to the video display independent from arid asynchronous with the first port, thereby allowing access to the memory contents during output of data to the video display terminal. Examples of multiport random access memories are described in U.S. Pat. No. 4,562,435 (issued Dec. 31, 1985), U.S. Pat. No. 4,639,890 (issued Jan. 27, 1987), and U.S. Pat. No. 4,636,986 (issued Jan. 13, 1987), all assigned to Texas Instruments Incorporated.

The multiport random access memory described in said U.S. Pat. No. 4,636,986 has four random access input/output terminals, and four serial access input/output terminals, so that the single memory device appears to have four memory arrays. This allows a single random access to read or write four data bits simultaneously, with a single address value, and also allows a by-four serial output for purposes of data communication to the video display. In a monochrome display system, for example, an external parallel-to-serial register can then receive the by-four serial output bits, and shift them one at a time to the video display at the display refresh rate. The buffering provided by the external parallel-to-serial register allows the memory serial register to shift at a rate 1/N of the rate of the video display (N being the number of serial outputs received by the parallel-to-serial register), further reducing the speed requirements of the semiconductor memory.

Other uses of the by-four organization provide for enhanced image display capabilities. For example, the by-four organization is useful in multi-color displays, since the four bits associated with each address can be associated with a common picture element ("pixel") of the display device. Such a configuration provides for the storage of a four bit binary code representative of color for each corresponding pixel of the video display. Another use of the four bits is to assign one of the bits or representing text, and the other three bits for representing color for a graphical background. The by-four memory thus facilitates the overlaying of a text message on a graphics image.

Referring to FIG. 10, a double-buffered display memory is shown. Such a system provides for the storage of updated display information into one of the frame buffers while the other buffer is providing its contents to the display device. A central processing unit 250 has its data output connected to a demultiplexer 252, shown schematically as providing data to memory plane groups 254A and 254B, each of which have N bit planes of bit-mapped data. Memory plane groups 254A and 254B provide data output to multiplexer 256, which provides an output to display 258. Control signals SEL and SEL_, the logical complement of one another, control the selection of demultiplexer 252 and multiplexer 256, respectively, so that memory plane group 254A is selected for input through demultiplexer 252 during such time as memory plane group 254B is selected for output through multiplexer 256 (and vice versa). In operation, one of memory plane groups 254 is providing display output to display 258 during such time as CPU 250 is providing input to the other memory plane group 254. After the display is completed, lines SEL and SEL_ toggle to the opposite data state, so that the opposite memory plane groups 254 receive data from CPU 250 and present data to display 258.

In such applications, it is often useful to clear, or write a particular data state, into a large number of memory locations in one of the planes. In the configuration where one of the bit planes carries the textual information. For example, it is useful to be able to clear the textual message without disturbing the other bit planes associated with the same pixels. If random accesses to each of the memory locations is required to write the desired "clear" data into each of the accessed locations, such an operation may take a large number of memory cycles, during which other operations on the display memory are precluded.

In the double-buffered system of FIG. 10, it is common practice to clear the contents of selected ones within the memory plane groups 254 to which data is to be provided, prior to the application of the updated data thereto. This allows CPU 250 to provide to the memory plane group 254 only the data required to draw the displayed image, as the background color information may be left undisturbed in the unselected ones of the memory planes. If random accesses of each memory location in a memory plane is required for the clearing operation, however, the time required for clearing subtracts from the time available for image drawing, as the clearing and drawing operation in the one of memory plane groups 254 selected to receive data is fixed by the time required for the other memory plane group to present its data to display 258.

It is therefore an object of this invention to provide a dual-port memory device having a selectable mode in which a large number of memory cells may be forced to a preselected data state in a single write cycle.

It is another object to provide such a dual-port memory with such mode, where said multiple memory cells consists of an entire row memory cells.

It is another object of this invention to provide such a dual-port memory, where the memory is organized in such a manner that it communicates with a plurality of parallel inputs, and where such a row write operation may be inhibited for memory cells associated with selected ones of said inputs during the write cycle.

It is therefore yet another object of this invention to provide such a dual-port memory having such a mode, and which further includes a data register containing the data states to be forced into the memory cells in the selected row during the given write cycle.

It is yet another object of this invention to provide such capability by a single capacitor and transistor associated with multiple columns in the memory device, thereby minimizing the silicon area required for the incorporation of the invention.

Other objects and advantages of the instant invention will become apparent to those of ordinary skill in the art having reference to the following specification, in combination with the drawings.

SUMMARY OF THE INVENTION

The invention may be incorporated Into a random access memory having a memory array organized into rows and columns, and which has a special operating mode in which a plurality of memory cells in the selected row may be written with the same data state simultaneously. A capacitor is provided which is of a size sufficient to store charge sufficient to override the sensing of the sense amplifiers in the memory device. A decoded data input signal selects whether the capacitor is to be connected to the bit line to which the selected memory cell is to be connected, or is to be connected to the bit line to which the dummy cell is to be connected. The capacitor is precharged to ground so that, when connected to the bit line of the dummy cell, the bit line is discharged to such a level that the sense amplifier senses a "1" from the selected cell, regardless of the data stored in the selected memory cell. Conversely, when the capacitor is connected to the bit line of the selected memory cell, the bit line is discharged to such a level that the sense amplifer senses a "0" from the selected cell, regardless of its stored contents. During the restore operation of the sense amplifier, the selected memory cell will be written with the data state sensed by the sense amplifier, which in effect "writes" the data provided by the capacitor thereinto. The memory may also be a multiple input/output memory, having a write mask capability so that the memory cells present in selected arrays (i.e., associated with selected ones of the multiple I/Os) will be undisturbed during the row write operation performed on the memory cells in the other arrays. An input data register may be provided for storing the row write data, or the data input terminals of the memory may provide the necessary data signals to select application of the additional capacitor to the data or data complement bit lines.

DETAILED DESCRIPTION OF THE PREFERRED EMBODIMENT

Figure 1:
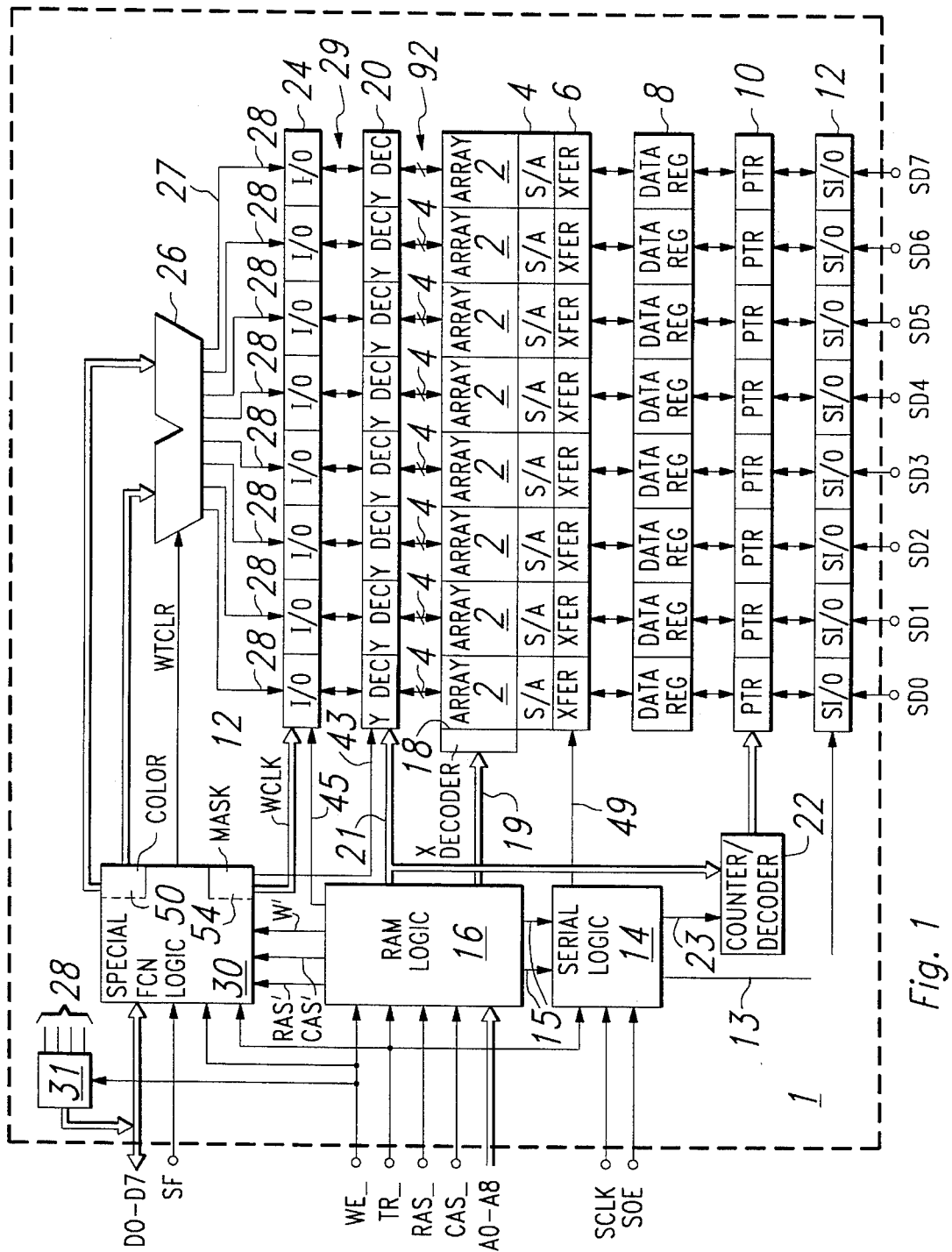
FIG. 1 illustrates a schematic block diagram of the preferred embodiment of a dual-port memory constructed according to the invention.

Referring now to FIG. 1, a functional block diagram of a dual port memory 1 constructed according to the instant invention, and containing an improved write mask feature, is illustrated. Similarly as the memory of said U.S. Pat. No. 4,636,986, incorporated herein by this reference, dual-port memory 1 receives and latches initial serial access address signals and random access address signals occurring on lines A0 through A8, clock signals RAS_, CAS_ and SCLK, write enable signal WE_, transfer enable signal TR_, and serial output enable signal SOE. It should be noted that only a single column address strobe CAS_ is received and utilized by dual-port memory 1 as the write mask feature is included therein. Dual-port memory 1 has eight random access input/output lines D0 through D7, rather than the four such input/output terminals of the memory of said U.S. Pat. No. 4,636,986; the invention to be described herein will of course be applicable to either organization, or other organizations of a dual-port memory. Accordingly, dual-port memory 1 contains eight arrays 2, each of which in this embodiment contain 128 kbits of storage organized in 512 rows and 256 columns. Accordingly, dual-port memory 1 of FIG. 1 contains 1 Mbit storage capability. Associated with each of the arrays 2 are sense amplifier banks 4, containing 256 sense amplifiers as are well known in the art for the sensing, restoring and writing of data from and into the dynamic memory cells of the arrays 2. There are eight serial data access input/output lines SD0 through SD7.

Looking to the serial side of dual-port memory 1, transfer gates 6 are connected to each of the bit lines in the arrays 2, similarly as in the dual-port memory of said U.S. Pat. No. 4,636,986, for transferring data from the arrays 2 into data registers 8, or vice versa. In this example, data registers 8 are 256-bit registers, so 256 bits of data are transferred by each bank of transfer gates 6; i.e., in each transfer cycle, 2048 bits of data are transferred. Serial logic 14 receives the serial clock signal on line SCLK, a serial output enable on line SOE and the transfer signal on line TR_, as well as signals on leads is from RAM logic 16, so that the transfer of data may be effected at the proper time, as in the memory of said U.S. Pat. No. 4,636,986.

Toggle counter/decoder 22 contains a counter and a decoder for selection of a storage element in each of data registers B to or from which serial input/output is to begin. Accordingly, toggle counter/decoder 22 receives the latched initial serial access address signal from RAM logic 16 on lines 21 which, as for the memory of said U.S. Pat. No. 4,636,986, selects the storage element position from which serial input or output is to begin. Serial logic 14 controls toggle counter/decoder 22 to load the latched initial serial access address value in a transfer cycle, as above, and also provides a signal to toggle counter/decoder 22 for each cycle of the clock signal on line SCLK so that the value of the counter in toggle counter/decoder 22 is incremented for each serial cycle. Toggle counter/decoder 22 provides the decoded value stored in its counter to each of pointers 10, one such pointer 10 associated with each of the data registers 8. The contents of data registers 8 are not shifted therewithin in each serial cycle as in the memory of said U.S. Pat. No. 4,636,986, but pointer 10 instead points to a bit therewithin, with the position incrementing with each cycle of the clock signal on line SCLK incrementing the contents of the counter in toggle counter/decoder 22 by way of a lead 23. In each of the data register 8, the storage element, which is pointed to by the associated one of pointer 10, is connected for input and output purposes to the associated one of serial input/output buffers 12, one of said serial input/output buffers being associated with each of the eight arrays 2 and data registers 8. Serial input/output buffers 12 communicate data between the associated serial input/output terminal SD0 through SD7 and the storage element of its associated data register 8 which is pointed to by pointer 10. The signal on line SOE, as before, indicates to serial logic 14 whether the serial operation is a write or a read operation, and by way of a lead 13 serial logic 14 controls the serial input/output buffers 12 accordingly. The serial logic controls the transfer gates 6 by signals over lead 49. Serial input and output therefore occurs functionally in a fashion similar as that for the memory of said U.S. Pat. No. 4,636,986 for eight serial input/outputs, except that the serial register function is accomplished by a non-shifting data register 8 from which a storage element therewithin is selected in an incrementing manner.

On the random access side, RAM logic 16 performs the address latching and decoding as performed in the memory of said U.S. Pat. No. 4,636,986, and therefore receives the row address strobe and column address strobe signals RAS_ and CAS_, respectively, and address lines A0 through A8. The row address value appearing on address lines A0 through A8 is latched by the row address strobe signal RAS_, and is communicated to X (ROW) decoder 18 via lines 19, so that X decoder 18 can select a row in each of the arrays 2 in response to the latched row address value that appears on lines 19. Similarly, the column address value appearing on address lines A0 through A7 (the column address signal on line A8 being unnecessary to select one of 256 columns) is latched by RAM logic 16 in response to column address strobe signal CAS_. The latched column address value is communicated from RAM logic 16 to Y decoders 20 by way of lines 21, each of the eight arrays 2 having a Y decoder 20 associated therewith. Each of the Y decoders 20 to connect the desired bit line to its associated input/output buffer 24, the Y decoders 20 being coupled to the input/output buffers 24 by leads 29. The Y decoders 20 are coupled, by leads 29, through sense amplifiers 4, to arrays 2. One sense amplifier from one of the sense amplifier groups 4 is coupled to a Y decoder from an associated Y decoder group 20 by leads 92 during a read operation, while one or a plurality of sense amplifiers (4 in the preferred embodiment illustrated in FIG. 7) from a sense amplifier group 4 can be coupled to associated Y decoders in a Y decoder group 20 by leads 92) during a write operation. The input/output buffers 24 are controlled by RAM LOGIC 16 over leads 45.

In addition to functions described in said U.S. Pat. No. 4,636,986, dual-port memory 1 has additional control over the random access data input/output functions. Such additional control is performed by special function logic 30. Each of the eight input/output buffers 24 is connected to the data terminals D0 through D7 by way of multiplexer 26. For purposes of random access read, the output of input/output buffers 24 is received by output drive circuitry 31 by means of leads 28 and is communicated therethrough to the terminals of lines D0 through D7. Output drive circuitry 31 is constructed in any one of a number of well known configurations, and is enabled from the external signal on line TR_ under the control of RAM logic 16 (through a connection not shown in FIG. 1). For purposes of random access write, of course, output drive circuitry 31 will be disabled by RAM logic 16 to prevent a data conflict.

During a random access write cycle, line WTCLR from special function logic 30 controls multiplexer 26 to select either the data value appearing at data terminals D0 through D7 or the contents of a color register 50 within special function logic 30 for sending to input/output buffers 24 via lines 27, depending upon the function selected by the user. Special function logic 30 is also operable to control the write mask feature similar to that described above for the memory of said U.S. Pat. No. 4,636,986. Special function logic 30 is operable, however, to store the value of the write mask in a write mask register 54 so that the write mask value can operate for a plurality of cycles, and so that the write mask value may be recalled many cycles after it is initially loaded, and after intervening cycles of non-masked random access writes. The contents of write mask register 54, or a non-masked write signal, as desired, are applied by special function logic 30 to input/output buffers 24 by way of lines WCLK, as will be described hereinbelow.

Figure 2:
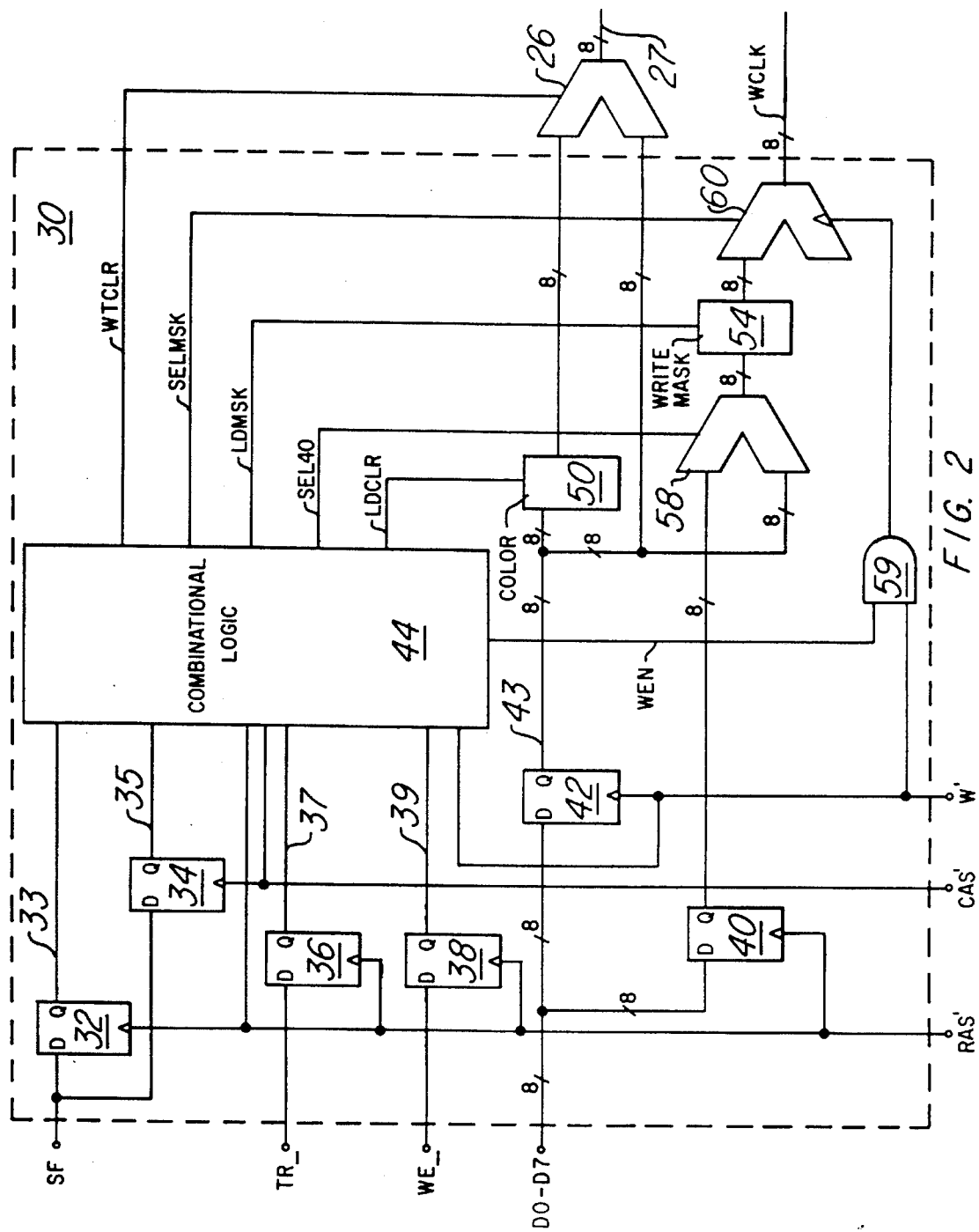
FIG. 2 illustrates a schematic block diagram of the special function logic of the dual-port memory of FIG. 1.

Referring now to FIG. 2, the construction and operation of special function logic 30 will be explained in detail. Special function logic 30 contains latches for storing the value of the various inputs thereto in conjuction with each of the row address strobe RAS_ and column address strobe CAS_ signals making high-to-low transitions, in a similar manner as the row and column addresses on address lines A0 through A8 are latched into RAM logic 16 of FIG. 1. Line SF, upon which the special function signal is presented from external to dual-port memory 1, is connected to the D-input of D-type latches 32 and 34. The clock input of latch 32 is clock signal RAS' which is a delayed clock pulse generated by RAM logic 16 from row address strobe signal RAS_. The clock input of latch 34 is clock signal CAS' which is similarly a delayed clock pulse generated by RAM logic 16 from column address strobe signal CAS_. Special function logic 30 further contains latch 36 which receives at its D input the external transfer signal on line TR_, and receives at its clock input the clock signal RAS'. Latch 38 receives the external write enable signal on line WE_, and also is clocked by clock signal RAS'.

The data input signals D0 through D7 are also latched relative to row address strobe RAS_, similarly as the signals discussed above, by latch 40 within special function logic 30. Latch 40 thus consists of eight latching circuits, each of which is clocked by clock signal RAS', for the storage of the eight data signals from the eight data lines D0 through D7. The output of latch 40 is connected to one input of a multiplexer 58, which has its output connected to the input of an eight bit write mask register 54. The contents of write mask register 54 correspond to which of the eight input/output buffers 24 of FIG. 1 will be enabled for a random access write mask operation, e.g., each one will enable an associated one of the input/output buffers 24 and each zero will enable an associated input/output buffer 24, or vice versa. The output of write mask register 54 is connected to a first input of a multiplexer 60, which has its other input connected to power supply $V_{dd}$. Each of the inputs to multiplexer 60 consist of eight parallel bits, with multiplexer 60 selecting between the eight bit output of write mask register 54 or an eight bit value of all "1" generated by $V_{dd}$. Multiplexer 60 is controlled by line SELMSK from combinational logic 44. Line SELMSK is set by combinational logic 44 to a high logic level when the contents of write mask register 54 are to generate the signals on the eight lines WCLK, each of said lines WCLK associated with one of input/output buffers 24. A high logic level on a line WCLK causes its associated input/output buffer 24 to write the value on one of lines 27 to the selected memory location in its array 2. Line SELMSK from combinational logic 44 being at a low logic level causes multiplexer 60 to apply power supply $V_{dd}$ to its output, signifying that all input/output buffers 24 are to perform a write operation, regardless of the contents of write mask register 54. It should be noted that multiplexer 60 is also controlled by the output of AND gate 59, which receives at its inputs clock signal W' and write enable signal WEN from combinational logic 44. The output of AND times 59 gates the application of the output from the multiplexer 58 to lines WCLK, so that the enabling signals on lines WCLK are applied to input/output buffers 24 at the proper time and so that no such enabling signals are applied during read cycles.

The data input signals on lines D0 through D7 are also latched into eight bit latch 42, responsive to a clock signal W', which is generated by RAM logic 16 upon the later of CAS_ and WE_ going low, as discussed below. The output of latch 42 is connected to the input of an eight-bit color register 50, is connected to one input of data multiplexer 26, and is connected to the second input of multiplexer 58. The output of color register 50 is connected to the other input of data multiplexer 26. Color register 50 is loaded with the output of latch 42 upon combinational logic 44 generating a high logic level on line LDCLR, in order to store a predetermined data pattern to be presented to the eight input/output buffers 24 during a subsequent write cycle during which the color register is selected as the data source. As is evident from FIGS. 1 and 2, data multiplexer 26 is operable to select either the contents of color register 50 or the contents of latch 42 for application to input/output buffers 24 via lines 27, responsive to the control signal WTCLR and timing from the output of AND gate 59. A high logic level on line WTCLR causes the contents of color register 50 to be applied to lines 27. As described above, output drive circuitry 31 applies the value of lines 27 to lines D0 through D7 during read cycles.

The output of latch 42 is also applied as described above, to a second input of multiplexer 58, to provide an alternative method for loading write mask register 54. As will be explained below in greater detail, combinational logic 44, responsive to the user selecting one of the two operation modes for loading write mask register 54, will generate a high logic signal on line LDMSK. Depending upon whether the contents of latch 40 (storing the value of lines D0 through D7 latched by RAS') or the contents of latch 42 (storing the value of lines D0 through D7 latched by WE' are desired, combinational logic 44 will control the application of the selected latch contents to write mask register 54 by line SEL40, which selects the output of latch 40 when high and the output of latch 42 when low.

Combinational logic 44 further generates a signal on line FW for enabling the selective row write mode, as will be described in further detail below. In addition, for purposes of the selective row write mode, the contents of write mask register 54 are presented by special function logic 30 on lines FWM for communication of write mask information for the selective row write feature, and the contents of color register 50 are similarly presented on lines FWD. As will be described below, the selective row write feature incorporated in this embodiment of RAM 1 does not utilize the write circuitry, but instead writes data by overriding the sensing operation by sense amplifiers 4; accordingly, the information used in this operation is preferably brought out independently from the write cycle timing.

Figure 3A:
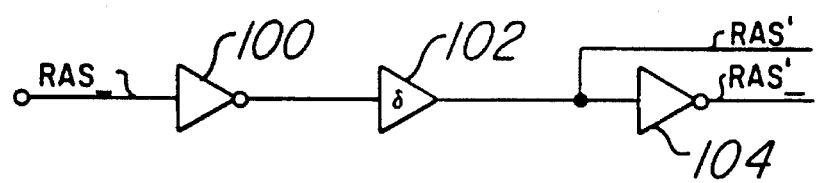
FIGS. 3a and 3b illustrate schematic diagrams of circuitry for generating clock signals used by the logic of FIG. 2.

Referring to FIG. 3a, the generation of clock signal RAS' is illustrated. The circuitry illustrated in FIG. 3a is resident within RAM logic 16 of FIG. 1. The row address strobe signal RAS_ generated externally from dual-port memory 1 is inverted by inverter 100 and after the desired delay through delay stage 102, generates the signal RAS' referred to above. An additional inversion by inverter 104 generates clock signal RAS_', which will be discussed below. It should be noted, of course, that the delays necessary, and indeed additional delayed versions of the signals RAS' and RAS_' are easily generated by those of ordinary skill in the art for use throughout dual-port memory 1 for a multitude of control functions. The signals CAS' and CAS_' may of course be generated within RAM logic 16 in a similar fashion, or by any of a number of methods well known by those of ordinary skill in the art.

Figure 3B:
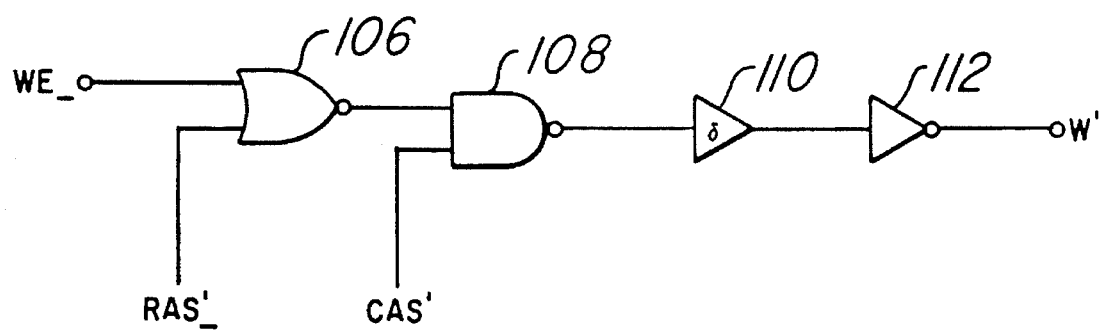

FIG. 3b illustrates the generation of the clock signal W' by RAM logic 16, such clock signal W' used in the circuit of FIG. 2. Line WE_ receives the externally generated write enable signal, which is gated by way of NOR gate 106 having its other input connected to line RAS_'. The output of NOR gate 106, which is at a high level only when the write enable signal WE_ occurs during a RAS_ active period, is connected to a first input of NAND gate 108, which has its other input connected to line CAS'. As described above, the clock signal on line CAS' is a delayed and inverted version of column address strobe signal CAS_. The output of NAND gate 108 is at a low logic level upon both the output of NOR gate 106 and signal CAS' being at a high logic level; i.e., upon the later to occur of WE_ and CAS_. By way of the desired delay by delay stage 110 and inversion by inverter 112, the clock signal W' utilized by the circuit of FIG. 2 is generated.

As generally discussed above, combinational logic 44 generates various control signals responsive to the stored state of latches 32, 34, 36 and 38, as presented on lines 33, 35, 37 and 39, respectively. These control signals control dual-port memory 1 to execute the operations of its various modes. Table 1 is a truth table for the various special modes of dual-port memory 1, certain of which will be further explained in detail hereinbelow.

TABLE 1

| RAS_ transition | | | CAS_ transition | |
|---|---|---|---|---|
| TR_ | WE_ | SF | SF | Function |
| 0 | 0 | 0 | X | Register-memory xfer |
| 0 | 0 | 1 | X | Selective row write |
| 0 | 1 | 0 | X | Memory-register xfer |
| 1 | 0 | 0 | 0 | Load write mask on RAS_; write data to array |
| 1 | 0 | 0 | 1 | Load write mask on RAS_; write color register to array |
| 1 | 0 | 1 | 0 | Use old write mask; write data to array |
| 1 | 0 | 1 | 1 | Use old write mask; write color register to array |
| 1 | 1 | 1 | 0 | Load write mask on WE_ |
| 1 | 1 | 1 | 1 | Load color reg. on WE_ |
| 1 | 1 | 0 | 1 | Disable write mask; write color register to array |
| 1 | 1 | 0 | 0 | Disable write mask; normal read/write |

As discussed above, control signal WTCLR is the signal generated by combinational logic 44 to cause data multiplexer 26 to select either the contents of color register 50 or the contents of latch 42 for application to the input/output buffers 24 of FIG. 1. Control signal LDCLR is a signal generated by combinational logic 44 to cause color register 50 to be loaded with the contents of latch 42. Control signal LDMSK is a signal applied by combinational logic 44 to write mask register 54, to cause write mask register 54 to be loaded with either the contents of latch 42 or the contents of latch 40, depending upon the state of SEL40 which controls the operation of multiplexer 58. The application of the contents of write mask register 54 to lines WCLK is enabled depending upon the logic state on line SELMSK from combinational logic Accordingly, combinational logic 44 is constructed of such logic necessary to generate the appropriate control signals responsive to the inputs presented thereto, and as will be described with reference to FIG. 4.

Combinational logic 44 receives the outputs of latches 32, 34, 36, and 38 on lines 33, 35, 37, and 39, respectively, as well as clock signals RAS' and W' described above. The construction and operation of combinational logic 44 will be described herein as it enables each of the special functions referred to above in Table 1.

As described above, write mask register 54 may be loaded from either the contents of latch 40 or the contents of latch 42. Since latch 42 is loaded responsive to the clock signal W', occurring upon the later of CAS_ and WE_, not only can write mask register 54 be loaded in different ways, but write mask register 54 can also be loaded at different times in a cycle, allowing increased flexibility for the user of dual-port memory 1.

For purposes of generating the signal on line FW for enabling the selective row write feature, which will be described in detail hereinbelow, combinational logic 44 further includes AND gate 131. AND gate 137 receives the state of lines 33, 39 and 37 (line 37 inverted by inverter 135 and line 39 inverted by inverter 116), so that an active logic state is generated on line FW at the output of AND gate 137 responsive to lines TR_ and WE_ being low, and line SF being high, at the time of the high-to-low transition of row address strobe signal RAS_.

Figure 5A:
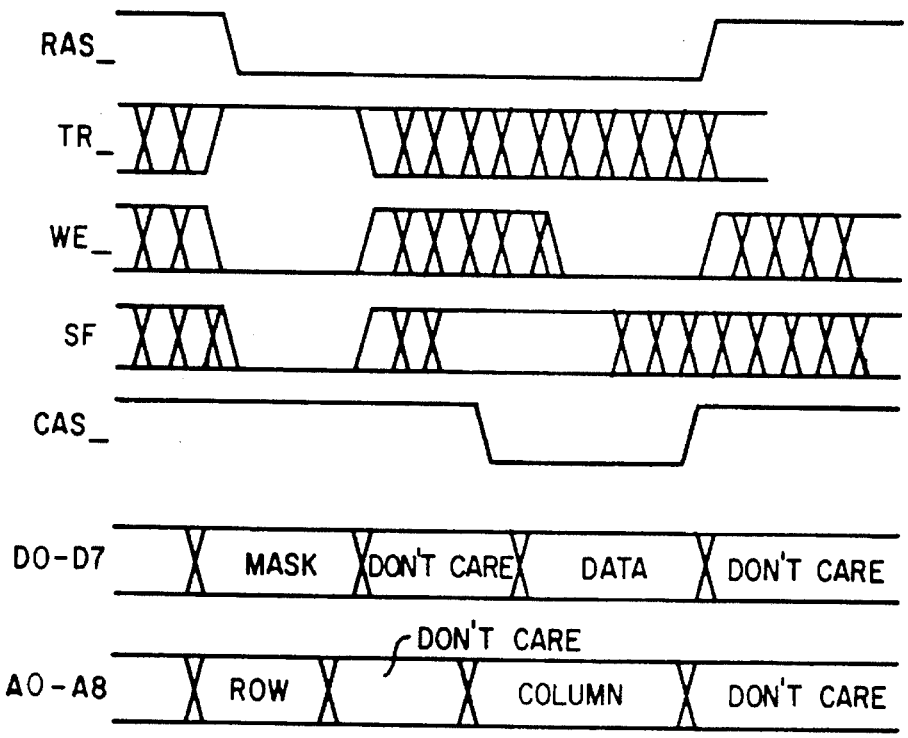
FIG. 5a illustrates a timing diagram of a memory cycle for loading the write mask register during the early portion thereof.

Referring to FIG. 5a, a timing diagram for the loading of write mask register from latch 40, i.e., during the first portion of the cycle, is illustrated. Table 1 indicates that write mask register 54 is loaded early when lines WE_ and SF are at a low logic level, and line TR_ at a high logic level, at the time that RAS makes its high-to-low transition, as shown in FIG. 5a. At this time, the value on data lines D0 through D7 is loaded into latch 40 (responsive to clock signal RAS'), and the values on lines SF, TR_, and WE_ are latched into latches 32, 36 and 38, respectively. The outputs of latches 32, 36 and 38 on lines 33, 37 and 39, respectively, are connected to the inputs of NAND gate 118 (lines 33 and 39 inverted by inverters 114 and 116). Accordingly, the output of NAND gate 118 will go to a low level upon the latched states of lines WE_ and SF at a low level and the latched state of TR_ being at a high level. This presents a logic low to one input of NOR gate 120, which has its other input controlled by clock signal RAS', delayed as desired by inverting delay stage 122 to allow the operation of the latches and logic to occur; upon the low-to-high transition of delayed clock signal RAS', the output of NOR gate 120 will go to a high level, generating a high level on line SEL40 to multiplexer 58 of FIG. 2, indicating that the output of latch 40 is to be selected. Line SEL40 is also connected to one input of OR gate 124, to generate a high level on line LDMSK. Line LDMSK is connected to write mask register 54, and upon making a low-to-high transition indicates that write mask register 54 is to be loaded with the value of the output of multiplexer 58 which, in the described case, is the contents of latch 40. By this operation, write mask register 54 is loaded during the first part of the memory cycle.

After the values of lines TR_, WE_ and SF are latched into their respective latches upon RAS_ going low, lines TR_, WE_ and SF are "don't cares" for purposes of the loading of write mask register 54 and can go to another logic level. Subsequent to the loading of write mask register 54, however, either a read or a write cycle may be performed by dual-port memory 1 depending upon the values placed on lines WE_ and TR_ (line TR_, as in the memory of said U.S. Pat. No. 4,636,986, serving as a random access output enable). FIG. 5a illustrates the more likely event of a write cycle occurring after the loading of write mask register 54 (the user's interest in performing a write operation is evidenced by the loading of write mask register 54). As shown in FIG. 5a, the row address value, i.e., the state of address lines A0 through A8 at the time of the RAS_ transition, is received during the time that write mask register 54 is being loaded; the row address decoding and selection occurs by way of RAM logic 16 and X decoder 18 in the well known RAM manner. The column address value is presented on lines A0 through A7 in conjunction with the column address strobe signal CAS_, as illustrated in FIG. 5a.

Table 1 indicates that the value of line SF at the time of the CAS_ transition determines whether the data received on lines D0 through D7 or the contents of color register 50 will be the data written to arrays 2. As shown in FIG. 2, latch 34 is loaded with the value of line SF responsive to clock signal CAS', which is a delayed and inverted signal relative to CAS_. Line 35 from the output of latch 34 is connected (after inversion by inverter 125) to one input of NOR gate 126 AND gate 127 receives at one of its inputs the output of NAND gate 118, which is at a low level as described above in the loading of write mask register 54; this of course forces a low logic level at the output of AND gate 127, which is presented to the other input of NOR gate 126. A high level will be generated at the output of NOR gate 126, and on line WTCLR, if the value of line SF at the time of the CAS transition is at a "1" logic level, and a low level on line WTCLR will be generated in the event that line SF is at a "0" level at the CAS_ transition. Line WTCLR is connected to the control input of data multiplexer 26 which applies the contents of color register 50 to lines 27 responsive to line WTCLR at a high logic level, and applies the contents of latch 42 to lines 27 when line WTCLR is at a low level. In this manner, combinational logic 44 is operable to select the data source for a write operation in the same memory cycle as a write mask register 54 load, said selection responsive to the value of line SF at the CAS_ transition.

Lines 33, 37 and 39 are also connected to the inputs of AND gate 128, line 33 being inverted by inverter 114 prior thereto. Accordingly, since the value of the WE_ line was at a logic "0" at the time of the RAS_ transition, the output of AND gate 128 is at a logic "0". The output of AND gate 128 is connected, through inverter 130, to line SELMSK which is connected to the control input of multiplexer 60. A high logic level on line SELMSK, as in this cycle where write mask register 54 is loaded responsive to the RAS_ transition, indicates that the contents of write mask register 54 are to be selected for generation of the signals on lines WCLK to input/output buffers 24 in addition, lines 33, 37 and 39 are also connected, with none inverted, to the inputs of AND gate 132; the output of AND gate 132 will also be at a logic low level, due to lines 33 and 39 being at logic low levels. The output of AND gate 122 is connected to inverter 134, which generates at its output the signal for line WEN connected to one input of AND gate 59 in FIG. 2. Accordingly, since the output of AND gate 132 is at a low level, line WEN is at a logic high level, enabling clock signal W' to gate, via multiplexer 60, the contents of write mask register 54 to lines WCLK. As described above, the signals on lines WCLK are the write clocks to input/output buffers 24, which will effect the writing of the data on lines 27 to arrays 2, with those input/output buffers associated with stored "0"s in write mask register 54 not performing a write operation. Therefore, upon the later of WE_ and CAS_ making a high-to-low transition while the other is active low (i.e., the transition of WE_ to a low level and back to a high level in conjunction with RAS_ transition does not generate the W' clock signal), a clock signal will be generated on line W', which will appear to gate the selected input of multiplexer 60 to lines WCLK to effect the write operation by input/output buffers 24.

Figure 6:
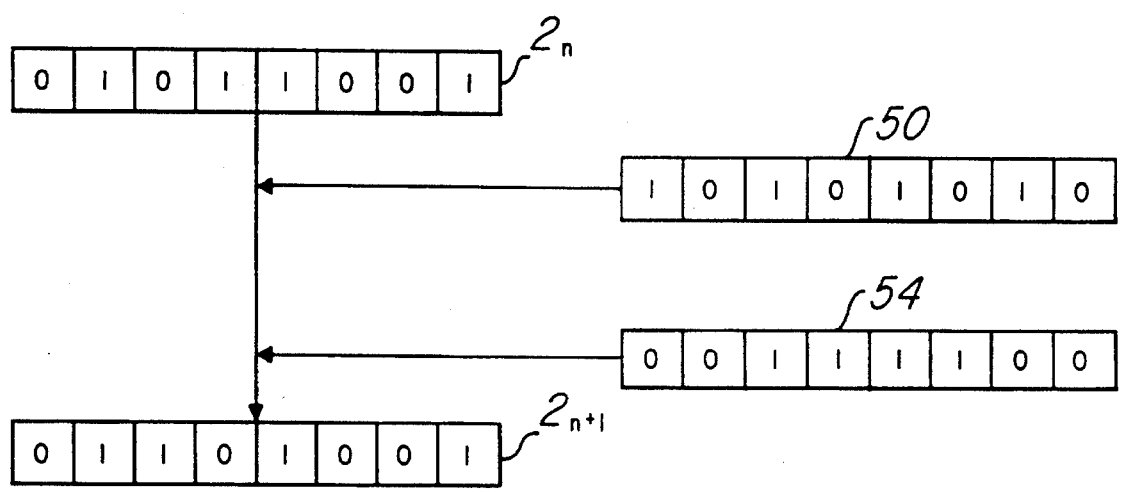
FIG. 6 is a register level illustration of a masked write operation.

FIG. 6 illustrates the masked write operation on a register-level diagram. An example of the eight storage elements of a memory location prior to the masked write operation is shown therein as $2_n$, with each of the eight storage elements corresponding to the addressed location within each of arrays 2 of dual-port memory 1. The data source containing the data to be written in this example is color register 50, an example of the contents of which illustrated in FIG. 6 as $10101010_2$. The contents of write mask register 54 are illustrated in FIG. 6 as writing only to the four center storage elements, i.e., the third through sixth least significant storage elements of the memory location; conversely, the write operation is "masked" relative to the two most and two least significant bits of memory location $2_n$. Upon performing the write cycle described above, where the contents of color register 50 is written in a masked write, the updated contents of the addressed memory location is shown in FIG. 6 as $2_{n+1}$. It should be apparent that only the center four storage elements are written with the contents of color register 50, with the two most and two least significant bits remaining the same as prior to the write operation.

Figure 5B:
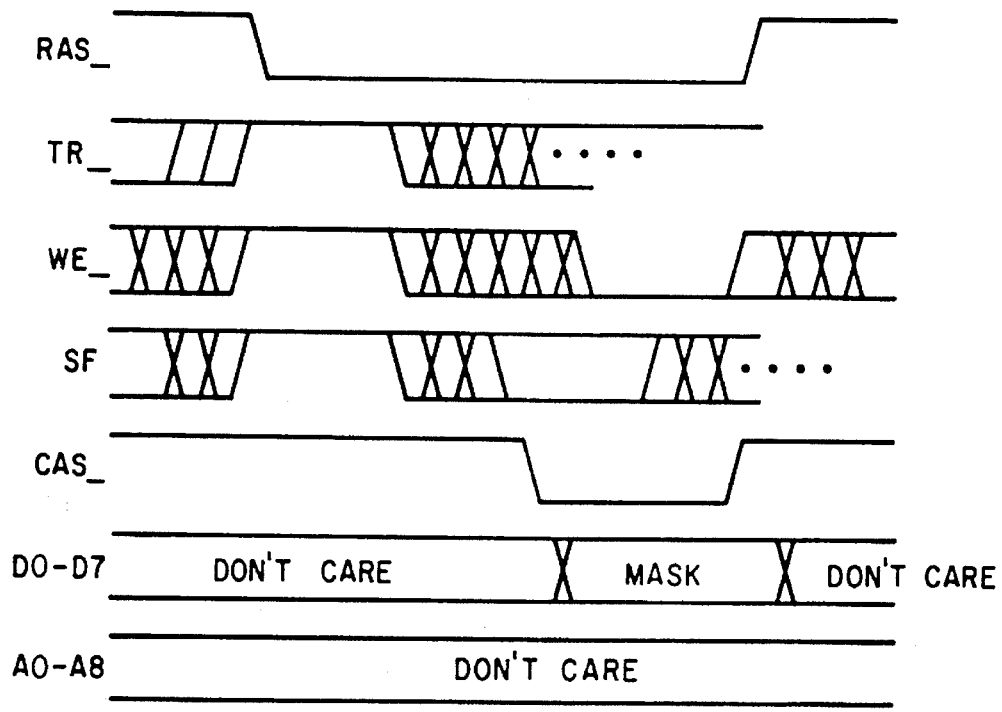
FIG. 5b illustrates a timing diagram of a memory cycle for loading either the write mask register or the color register during a latter portion thereof.

As mentioned above, dual-port memory 1 can load write mask register 54 during the latter portion of the memory cycle, by way of latch 42 clocked by clock signal W'. FIG. 5b illustrates a timing cycle for the loading of write mask register in the latter portion of the memory cycle. Lines 33, 37 and 39 are, as discussed above, connected to the inputs of AND gate 132 without any of the three signals being inverted, so that the output of AND gate 132 is at a high level when all three are at a high level. This corresponds to Table 1, where the late loading of write mask register 54 is enabled by lines SF, WE_ and TR_ being at a high logic level at the RAS_ transition. The high level at the output of AND gate 132 presents, via inverter 134, a low level on line WEN which disables any write clock signals from being presented on lines WCLK, thereby preventing a write operation to arrays 2. The output of AND gate 132 is connected to one input of NAND gate 136, which has line W' connected to its other input; until the later of WE_ or CAS_ (after the RAS_ transition), the output of NAND gate 136 will remain at a high logic level. NOR gate 138 receives the output of NAND gate 136 at one input, and receives the output of latch 34 on line 35 at its other input; as stated above, latch 34 stores the value of line SF at the time of the CAS_ transition. Table 1 indicates that write mask register 54 is loaded when line SF is at a "0" level at the CAS_ transition, when lines SF, WE_ and TR_ are all high at the RAS_ transition. Accordingly, for load of write mask register 54, line 35 will be at a low level responsive to clock signal CAS' latching the low level on line SF into latch 34.

The loading of write mask register 54 is completed upon the later of WE_ or CAS_ (after the RAS_ transition_). The example illustrated in FIG. 5b shows WE_ making its transition after CAS_, and the following description will use this example. Referring back to FIG. 2, latch 42 will be loaded with the value on lines D0 through D7 upon clock signal W', which is generated upon the later of WE_ and CAS_ making a high-to-low transition (while the other is active; see FIG. 3b) FIG. 5b illustrates the presentation of the contents of write mask register 54 as "MASK" on data lines D0 through D7 at the time of WE_ going low. In addition, clock signal W' causes the output of NAND gate 136 to go to a low level, thereby generating a high level at the output of NOR gate 138. This generates, via OR gate 124, a high level on line LDMSK which causes a load of write mask register 54 with the output of multiplexer 60. Since the output of NAND gate 118 is at a "1" level (line 39 being at a high level), line SEL40 will be at a low level by operation of NOR gate 120. As described above, a low level on line SEL40 will control multiplexer 60 to select the contents of latch 42 for application to write mask register 54 upon the LDMSK signal generated above; latch 42 is storing the value of data lines D0 thorugh D7 loaded thereinto at this time. In this manner, combinational logic 44 effects the late load of write mask register 54 by way of the timing of FIG. 5b, with line SF at a low level at the CAS_ transition.

Color register 50 is loaded In the same manner as write mask register 54 in the late-load mode, only with line SF at a high level at the CAS_ transition as indicated in Table 1. This is effected by NOR gate 140 which receives the output of NAND gate 136 discussed above, and which receives line 35 after inversion by inverter 125. A high logic level on line SF at the CAS_ transition results in a low level at one input of NOR gate 140. Upon the later of WE_ and CAS_ making a high-to-low transition, the output of NAND gate 136 goes to a low level as described above, driving the output of NOR gate 140 to a high level. The output of NOR gate 140 is line LDCLR which is connected to color register 50 and which, at a high level, causes color register 50 to be loaded with the contents of latch 42. Latch 42, as described above, loaded with the value of data lines D0 through D7 responsive to clock signal W' (i.e., the value "CONTENTS" of FIG. 5b).

It should be noted that for either the loading of color register 50 or of the late loading of write mask register 54 random access of dual-port memory 1 is inhibited. As illustrated in FIG. 5b, this causes the values of the addresses on lines A0 through A8 to be "don't cares" at both the RAS_ and CAS_ transitions.

It is useful, as discussed hereinbefore, to be able to use the contents of write mask register 54 in a multiple of memory cycles, as well as to be able to perform unmasked write operations without requiring the reloading of the write mask information prior to performing a subsequent masked write operation. Accordingly, Table 1 indicates that certain modes of operation are available to repeatedly use the contents of write mask register, as well as to perform unmasked write operations while retaining the write mask information in write mask register 54. Special function logic 30, and combinational logic 44 therewithin, are designed to accomplish these functions.

Figure 4:
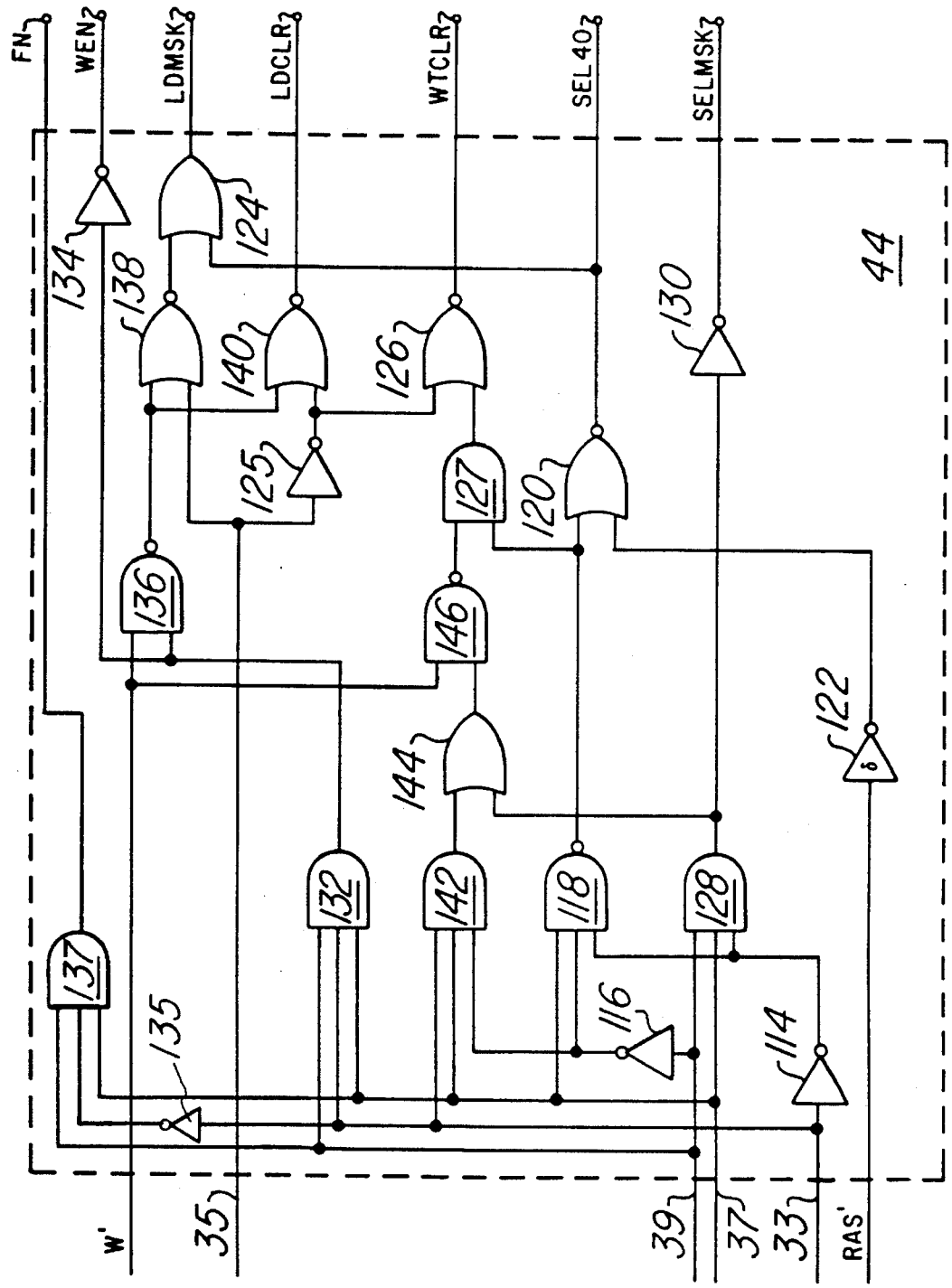
FIG. 4 illustrates a schematic diagram of combinational logic within the special function logic of FIG. 2.
Figure 5C:
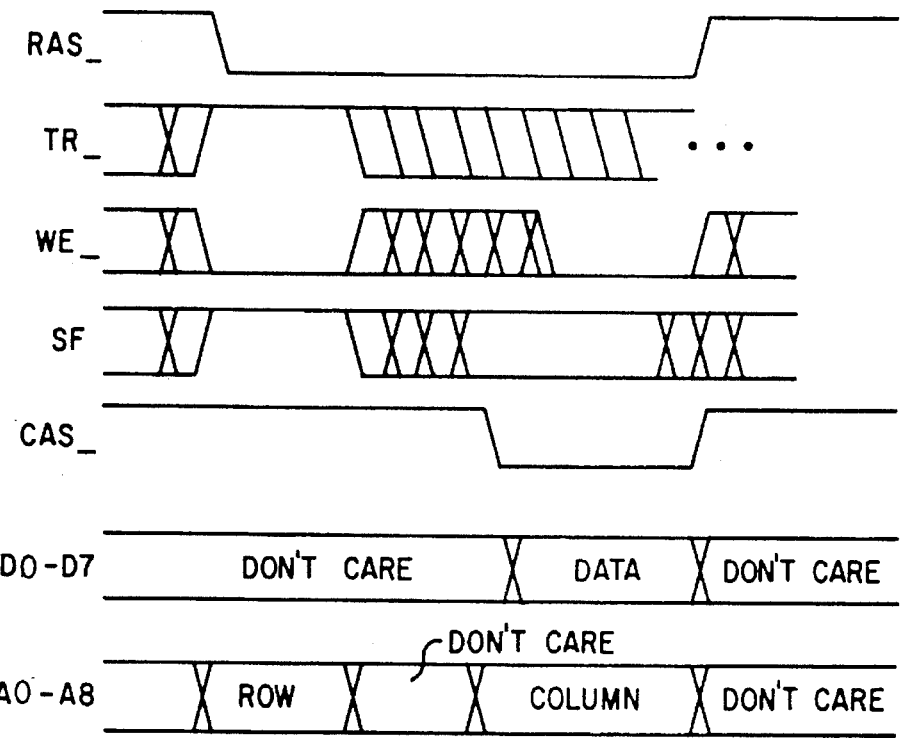
FIG. 5c illustrates a timing diagram of a memory write cycle utilizing the contents of the write mask register loaded in a previous cycle.

FIG. 5c is a timing diagram illustrating the operation of a masked write cycle, without the reloading of write mask information, i.e., utilizing the prior contents of write mask register 54. Upon the RAS_ transition, lines TR_ and SF are at a high logic level, while line WE_ is at a low logic level. As before, latches 32, 36, and 38 latch in these values upon clock signal RAS', for receipt by combinational logic 44. Referring to FIGS. 2 and 4, since the output of AND gate 128 is at a logic low level for this combination, line SELMSK will be at a high level, so that the contents of write mask register 54 will be selected for application to lines WCLK upon the output of AND gate 59 going to a high level. Since this combination of lines TR_, SF and WE_ on the RA5_ transition causes the output of AND gate 132 to be at a low level, so that line WEN will be at a high level, which allows the later of WE_ and CAS_ going low to apply the output of multiplexer 60, i.e., the contents of write mask register 54, to lines WCLK.

For the above-described combination of lines TR_, SF and WE_ on the RAS_ transition, however, the contents of write mask register 54 applied in this cycle will be unchanged from its prior state. The reloading of write mask register 54 is precluded by combinational logic 44, since the low level output of AND gate 132 also causes the output of NAND gate 136 to be at a high level and, in turn, the output of NOR gate 138 to be at a low level. Since the output of NAND gate 118 is at a high level for the above combination of lines $TR_{13}$, SF and WE_ on the RAS_ transition shown in FIG. 5c, a low level is forced at the output of NOR gate 120. Therefore, both inputs to OR gate 124 are low, which forces a low level on line LDMSK, precluding write mask register 54 from being reloaded. The prior contents of write mask register 54 are thereby retained, and are utilized in the write cycle as selected by line SELMSK described above.

Depending upon the state of line SF upon the CAS_ transition, the data applied to lines 27 for the masked write operation can be either the contents of color register 50 or the value of data lines D0 through D7 which have been latched by latch 42 upon clock signal W'. Combination logic 44 illustrated in FIG. 4 allows this selection according to the truth table of Table 1, by way of AND gate 142 having its three inputs connected to lines 33, 37 and 39, with line 39 inverted by inverter 116. The output of AND gate 142 thus will have its output at a high logic level responsive to the combination upon the RAS_ transition of lines TR_ and SF at a high logic level and while line WE_ at a low logic level. The output of AND gate 142 is connected to a first input of OR gate 144, driving the output of OR gate 144 high when it is at a high level. The output of OR gate 144 is connected to a first input of NAND gate 146, which has its other input connected to clock signal W' described above, and its output connected to an input of AND gate 127. NAND gate 146 therefore has its output driven low when the output of AND gate 142 is at a high level upon the low-to-high transition of clock signal W'. The low level of the output of NAND gate 146 forces a low level at the output of AND gate 127 which presents a low level at an input of NOR gate 126 as discussed above. Similarly as discussed above for the cycle of FIG. 5a, line WTCLR is driven high or low by operation of line 35 from latch 34, which stores the value of line SF upon the CAS_ transition, thereby controlling data multiplexer 26 to select the contents of color register 50 for application to lines 27 to input/output buffers 24, or to select the value of data lines D0 through D7. FIG. 5c illustrates the timing required for data lines D0 through D7 to present valid data ("DATA") in the event that such input data is the desired data source. As described above, latch 42 latches the input data upon clock signal W', with the output of latch 42 applied to one input of data multiplexer 26, for selection if desired by the user.

Figure 5D:
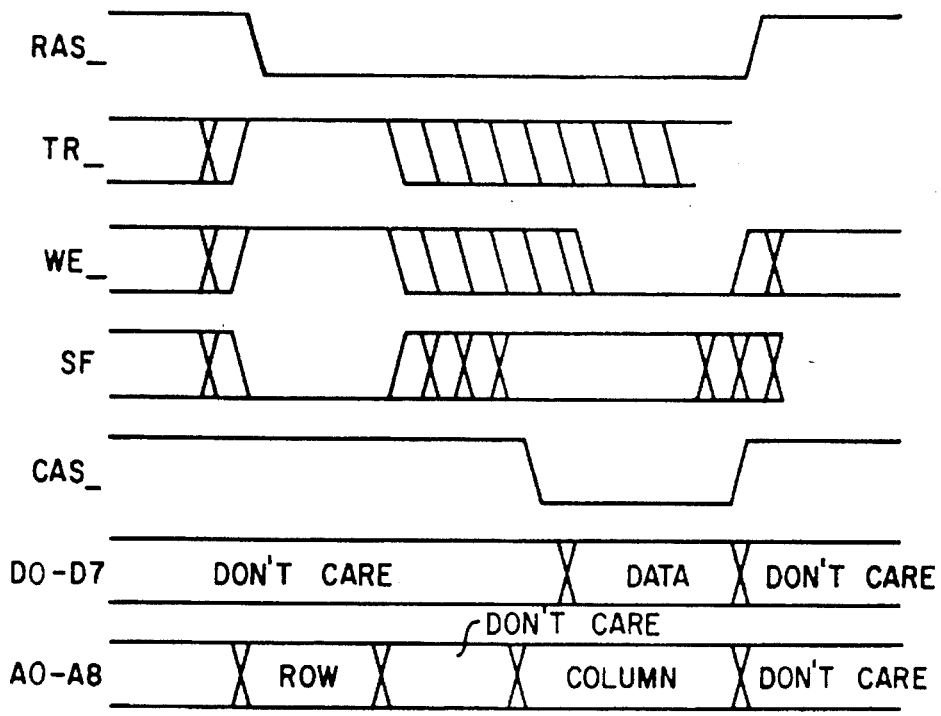
FIG. 5d illustrates a timing diagram of a memory write cycle ignoring the contents of the write mask register without destroying its contents.

The contents of write mask register 54 may be ignored for a write operation, yet retained for subsequent masked write operations, by a special cycle effected by special function logic 30, and combinational logic 44 therewithin. The timing of an example of such a cycle is illustrated in FIG. 5d. Upon the RAS_ transition, as stated in Table 1, lines TR_ and WE_ are at a high logic level while line SF is at a low level; as before, these values are latched into latches 36, 38 and respectively, by clock signal RAS'. This combination, presented on lines 37, 39 and 33 (line 33 inverted by inverter 114) causes the output of AND gate 128 to go to a "1" logic level, placing a low logic level on line SELMSK so as to cause multiplexer 60 to select $V_{dd}$ for application to lines WCLK at the proper time, ignoring the contents of write mask register 54. Since the contents of latch 32, corresponding to the state of line SF low on the RAS_ transition, is at a low level, the output of AND gate 132 is also low, placing a high level on line WEN so that clock signal W' will be passed through to multiplexer 60 for generation of the high logic levels on all of lines WCLK, due to line SELMSK being low. As for the prior write cycles, FIG. 5d illustrates that line WE_ is driven low after the CAS_ transition, to effect the write operation via write signal W'.

Similarly as in the case of FIG. 5b, loading of write mask register 54 is precluded, since the outputs of AND gate 132 is low and the output of NAND gate 118 is high for the combination of lines TR_ and WE_ high with line SF low upon the RAS_ transition. Since no new value is loaded into write mask register 54 (line LDMSK staying low), the prior value stored therein is retained. Accordingly, a subsequent cycle such as that illustrated in FIG. 5c will cause a masked write operation, using the write mask information retained in write mask register 54, without the need to reload the write mask information.

As discussed above relative to FIG. 5c, the state of line SF at the time of the CAS_ transition will control whether the write cycle FIG. 5d uses color register 50 as the data source (line SF being a "1") or uses the value of data lines D0 through D7 ("DATA" of FIG. 5d) as the data source. Combinational logic 44 effects this selection since the output of AND gate 128 is connected to a second input of OR gate 144, thereby having the same effect on the generation of the WTCLR signal by NOR gate 126 as the output of AND gate 142 discussed above relative to the cycle of FIG. 5c.

In the use of a dual-port memory such as dual-port memory 1 shown in FIG. 1 in a video system, often a number of successive memory locations may be written with identical data. For example, where dual-port memory 1 contains a bit-mapped representation of a graphics image, a large area of the displayed image may be filled with a certain color. Accordingly, it would be useful to write identical data to multiple locations during a dual-port memory in single cycle.

Figure 7:
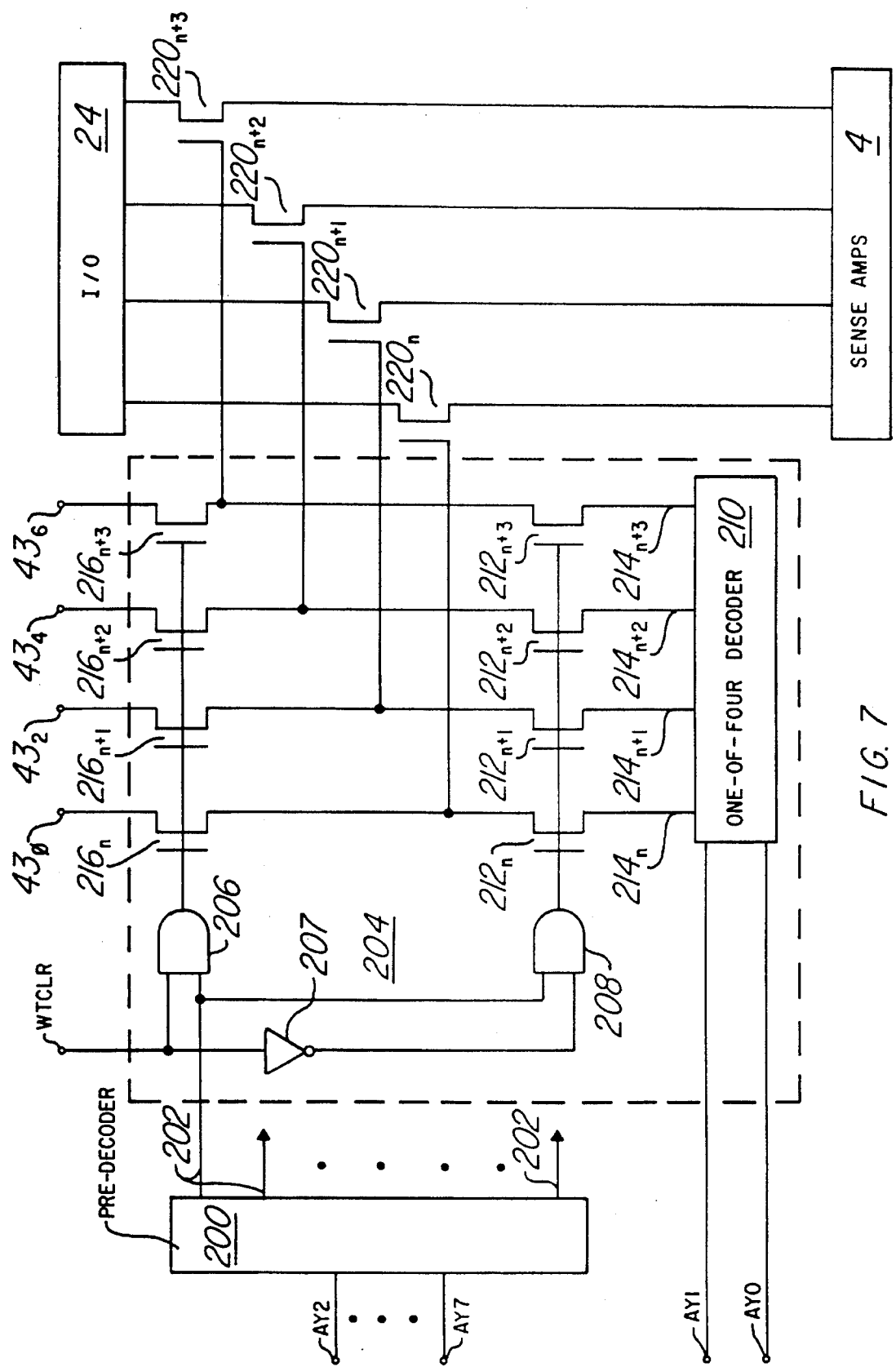
FIG. 7 is a schematic diagram of a column decoder which incorporates the addition of a block write feature to the memory of FIG. 1.

Referring now to FIG. 7, a block diagram of Y decoder 20 is illustrated which contains circuitry for performing the feature of addressing adjacent columns therewithin in a single cycle, hereinafter referred to as the "block write" feature. While the operation of dual-port memory 1 may be enhanced by the feature described hereinbelow relative to FIG. 7, it should be noted that dual-port memory described hereinabove is fully operable without the block write feature. It should be noted that FIG. 7 illustrates Y decoder 20 for a single array 2 in dual-port memory 1, of course, the circuitry illustrated in FIG. 7 will be associated with each of arrays 2 shown in FIG. 1. Y decoder 20, as described above, receives the latched values of the column address received on address lines A0 through A7; these latched column address valves are represented by lines AY0 through AY7 on FIG. 7. Since only 256 columns are present in each of arrays 2, the value of address line A8 latched by the CAS_ signal is not utilized in the column decoding operation. Pre-decoder 200 receives lines AY2 through AY7, and decodes these six bits into 64 output lines 202, only one of which will be enabled at any given time by being at a high logic level. When at the high level, each output line 202 selects a different group of four columns in its associated array 2.

Associated with each group of four columns is column select circuit 204; only one column select circuit 204 is illustrated in FIG. 7, for the sake of simplicity. The associated output line 202 from pre-decoder 200 is connected to one input of AND gate 206, and to one input of AND gate 208, within the column select circuit 204. The signal on line WTCLR from special function logic 30 is applied to the second input of AND gate 206 and after inversion by inverter 207, is applied to the second input of AND gate 208. As described above, the signal WTCLR is generated when the contents of color register 50 are to be written into arrays 2. The feature described herein for addressing multiple columns within each of arrays 2 is enabled by the same signal WTCLR. Also included within column select circuit 204 is a one-of four decoder 210 which performs the actual decoding of the two least significant column address bits on lines AY0 and AY1, in selecting the one column of the selected group of columns within array 2 which is to be addressed in the random access mode. One-of-four decoder 210 drives four lines $214_n$ through $214_{n+3}$, depending upon the value of the signals on lines AY0 and AY1. Pass transistors $212_n$ through $212_{n+3}$, each connects its corresponding line $214_n$ through $214n+3$ to the gate of its corresponding transistor $220_n$ through $220_{n+3}$. The gates of pass transistors $212_n$ through $212_{n+3}$ are controlled by the output of AND gate 208. Accordingly, in the event that the block write feature is selected, i.e., line WTCLR is at a high logic level while corresponding output line 202 is selecting the group, the result of one-of-four decoder 210 will be ignored because the AND gate 208 is disabled.

Column select circuit 204 further receives the even bits of the contents of latch 42, shown in FIG. 7 as lines $43_0$, $43_2$, $43_4$ and $43_6$. As described above, latch 42 stores the value of data input lines D0 through D7 received at the time of the later of the write enable signal on line WE_ or the column address signal on line CAS_ in each cycle. Each of lines $43_0$, $43_2$, $43_4$ and $43_6$ is connected to the conduction path of a different one of the pass transistors $216_n$ through $216_{n+3}$, each of which has its gate connected to the output of AND gate 206. The other end of the conduction path of the pass transistors $216_n$ through $216_{n+3}$ is connected to the gate of its corresponding transistor $220_n$ through $220_{n+3}$.

Each of the transistors $220_n$ through $220_{n+3}$ connects the input/output buffer 24 associated with array 2 to the sense amplifer 4 associated with its column, in order to accomplish the write operation for the selected columns, in a manner well known in the art. For the normal operating mode where line WTCLR is not enabled, the output of AND gate 206 is at a logic low, disabling lines $43_0$, $43_2$, $43_4$ and $43_6$ from affecting the state of transistors $220_n$ through $220_{n+3}$. At the same time, the output of AND gate 208 for the column select circuit 204 selected by pre-decoder 200 will be at a logic high level, allowing the result of one-of-four decoder 210 to control the connection of the associated input/output buffer 24 to the sense amplifier 4 for the one selected column.

When the block write feature is selected by the state of lines WE_, SF and TR_ as shown in Table 1 for the enabling of line WTCLR by combinational logic 44, the output of AND gate 206 will be at a high level in the column select circuit 204 for the group of four columns which are selected by pre-decoder 200 responsive to lines AY2 through AY7. In this event, the state of lines $43_0$, $43_2$, $43_4$ and $43_6$ will determine which of transistors $220_n$ through $220_{n+3}$ will be conductive, and indeed allows the connection of the sense amplifiers of up to all four of the columns, in the group, to be connected to the input/output buffer 24. The contents of the stage of color register 50 corresponding to the array 2 will then be written into all of the columns selected by the state of lines $43_0$, $43_2$, $43_4$ and $43_6$, from latch 42.

Figure 8:
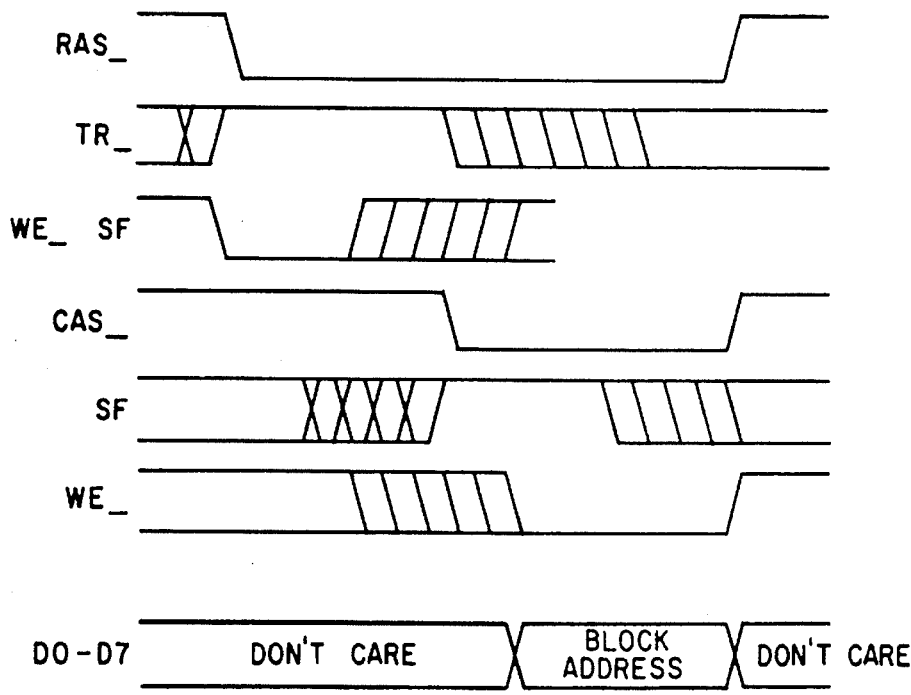
FIG. 8 is a timing diagram of the operation of a block write cycle, using the circuitry of FIG. 7.

Referring now to FIG. 8, a timing diagram illustrates the operation of the block write feature. As is evident from Table 1 above, the contents of color register 50 are written in write cycles when line TR_ is high at RAS_ going active with either line WE_ or line SF low at that time, in conjunction with line SF being high when column address signal CAS_ goes active. According to Table 1 and as illustrated in FIG. 8, the write operation of the color register (and, in this embodiment, the block write feature), requires at the time that row access strobe signal RAS_ goes active in its low state, that line TR_ is high, and that the logical AND of WE_ and SF is low; at the time that column access strobe signal CAS_ goes active, line SF must be in its high state. With the block write mode thus enabled, the value of the even bits of the data input signal on lines D0, D2, D4 and D6 at the time of the later of CAS_ or WE_ going active designates the columns in the group of four which are to be written with the value of the data stored in the color register 50 for the corresponding array 2. As explained above, all four of such columns are addressable in this block write mode, thereby providing the feature that four columns in each of the eight arrays 2 may be written in a single cycle.

Figure 9:
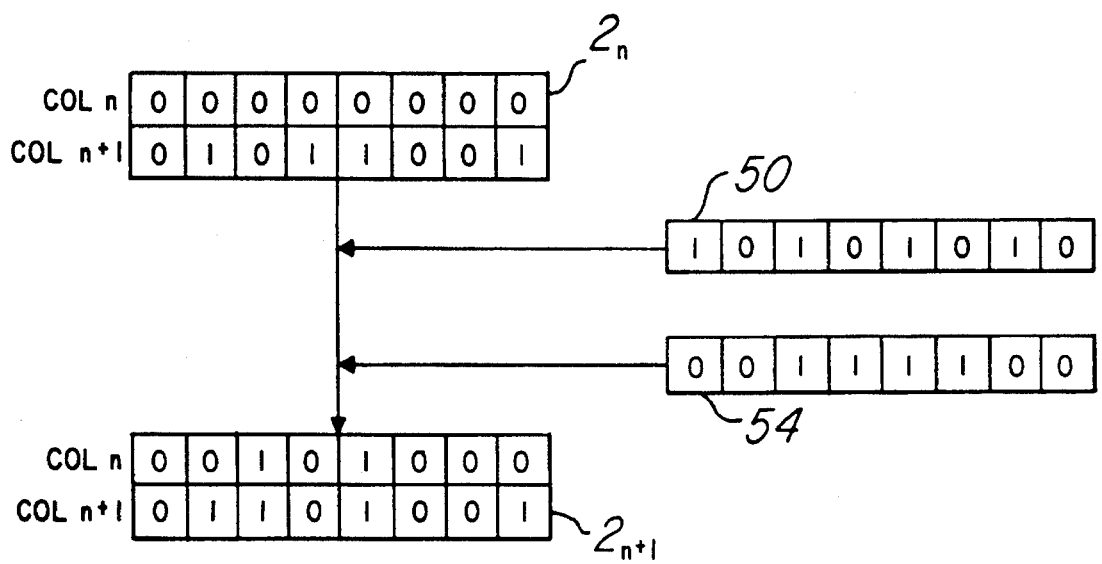
FIG. 9 is a register level illustration of a block write cycle, using the circuitry of FIG. 7.
Figure 10:
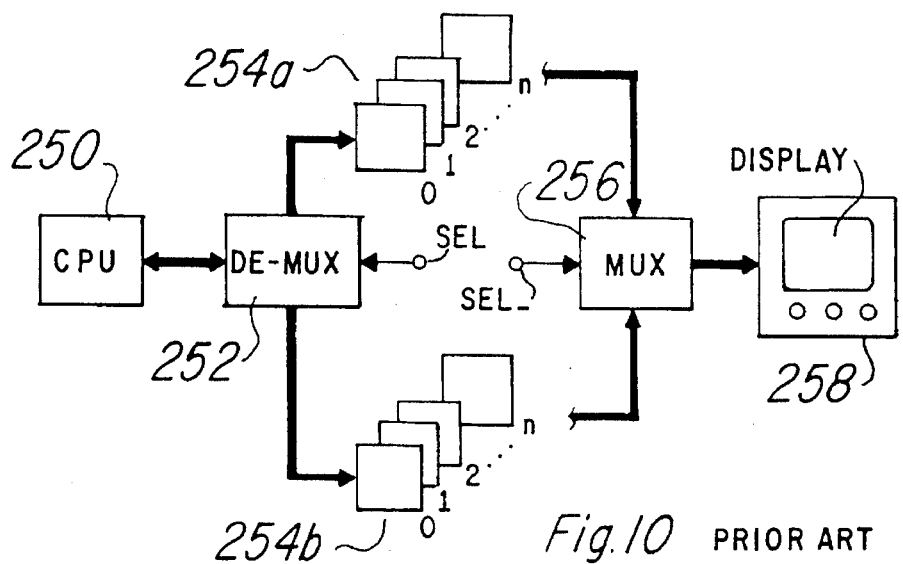
FIG. 10 is an electrical diagram, in block form, of a double-buffered display system constructed according to the prior art, into which the incorporation of the present invention would be useful.

Referring again to Table 1, in the event that both line SF and line WE_ are low at the time RAS_ goes active, the masked write operation will be enabled along with the block write feature. In this way, the contents of color register 50 may be written to multiple columns (within a group of four), to only selected arrays. Referring to FIG. 9, a register level illustration of the application of the color register 50 and write mask register 54 is illustrated in modifying the contents of the memory locations in each of the arrays 2 associated with two columns $COL_n$ and $COL_{n+1}$. As described above, columns n and n+1 would be selected in the event that data lines D0 and D2 had a "1" logic level, and data lines D4 and D6 had a "0" logic level, at the time of write enable line WE_ going active after CAS_ is active in the timing of FIG. 8. As in the example of FIG. 6, only the third through sixth least significant memory locations are written with the contents of color register 50. According to the block write feature explained above, however, this masked write operation takes place simultaneously in selected columns $COL_n$ and $COL_{n+1}$.

Figure 11:
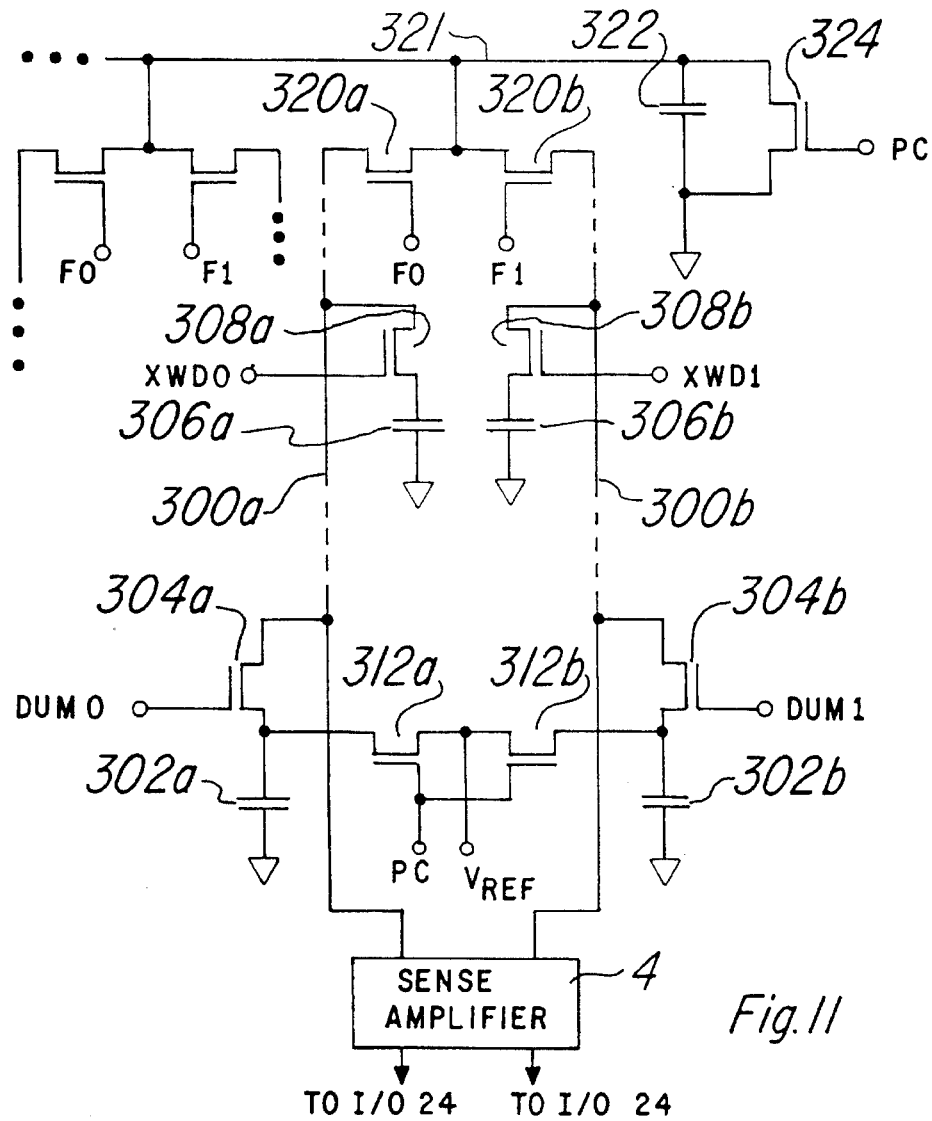
FIG. 11 is an electrical diagram, in schematic form, of circuitry in a memory incorporating the selective row write feature of the instant invention.

Referring now to FIG. 11, the construction and operation of additional circuitry within RAM 1 for performing a selective row write operation will be described in detail. FIG. 11 illustrates a single sense amplifier 4, which is connected to two bit lines 300a and 300b. The configuration of the circuitry illustrated in FIG. 11 is of the "folded" bit line type, similarly as described in U.S. Pat. No. 4,658,377, issued Apr. 14, 1987 to David J. McElroy and assigned to Texas instruments Incorporated. Data is stored in the form of charge storage in storage capacitors 306a and 306b, connectable to bit lines 300a and 300b by way of transfer gates 308a and 308b, respectively. Transfer gates 308a and 308b are controlled by row select signals XWD0 and XWD1, respectively, which are generated by X decoder 18 from the decoding of the row address signal received by RAM 1. Of course, a number of storage capacitors 306 will be associated with each of sense amplifiers 4, half of which will be connectable to bit line 300a and half connectable to bit line 300b (e.g., 512 of storage capacitors 306, 256 of which are connectable to each of the bit lines 300a and 300b, for a 1 Mbit RAM in a 512 by 2048 configuration). A single storage capacitor 306 is shown associated with each of bit lines 300a and 300b in FIG. 11 for purposes of simplicity. Unique row address signal lines will be associated with each storage capacitor 306 associated with sense amplifier 4; only one of the row select signals (e.g., only one of signals XWD0 and XWDI) will be asserted to a high (active) level during an access cycle. Associated with each of bit lines 300a and 300b are dummy capacitors 302a and 302b, which serve to store a reference charge against which the charge in the selected storage capacitor 306 will be compared by sense amplifier 4. In this embodiment, dummy capacitors 302 are of substantially the same size and have the same capacitance as storage capacitors 306. Dummy capacitors 302a and 302b are connectable to bit lines 300a and 300b by way of dummy transfer gates 304a and 304b, respectively. Dummy transfer gates 304a and 304b are controlled by dummy word line signals DUM0 and DUM1, respectively, which are generated by X decoder 18 responsive to the row address signal, in a manner described below.

Further connected to dummy capacitors 302a and 302b are dummy precharge transistors 312a and 312b, each of which are connected to a voltage $V_{ref}$. The gates of dummy precharge transistors 312 are controlled by a precharge clock signal PC, which is applied during the precharge portion of the memory cycle, during which time lines DUM0 and DUM1 are at a low state so that dummy capacitors 302 are isolated from their associated bit lines 300. During the application of the precharge clock signal, transistors 312 are turned on, and the voltage $V_{ref}$ is applied to dummy capacitors 302, storing the associated charge therein. In this embodiment, the voltage $V_{ref}$ is approximately ⅓ of the supply voltage $V_{dd}$ to RAM 1; since dummy capacitors 302 have approximately the same capacitance value as storage capacitors 306, approximately ⅓ of a full "1" state is thus stored in each of dummy capacitors 302 during precharge (a full "1" being written or restored into storage capacitors 306 by the application of a $V_{dd}$ level). The ⅓ $V_{dd}$ level in dummy capacitors 302 is preferred in this embodiment so that the reference charge is approximately equidistant between a "1" and a "0" level, allowing for degradation of a full stored "1" level due to storage capacitor leakage and other effects.

As described in said U.S. Pat. No. 4,658,377, bit lines 300a and 300b are preferably equalized and precharged to a voltage of ½ $V_{dd}$; since one of bit lines 300 will be substantially at $V_{dd}$ and the other will be substantially at ground after the restore operation of sense amplifier 4 in the prior memory cycle, the ½ $V_{dd}$ precharge may be accomplished in great part merely from the equalization of the two bit lines 300a and 300b to one another, with a minimum of external power then required to precharge bit lines 300 to the desired voltage. This equalization and procharge occurs after the active cycle, and can of course occur during the precharge of dummy capacitors 302.

As described in said U.S. Pat. No. 4,658,377, the folded bit line arrangement operates by connecting the storage capacitor 306 in the selected row to one of the bit lines 300 while connecting the dummy capacitor 302 to the opposite bit line 300 in the bit line pair. For example, if storage capacitor 306a were to be selected, row select signal XWD0 would be active, turning on transfer gate 308a so that storage capacitor 306a would be connected to bit line 300a. The value of the decoded row address would drive dummy word line DUM1 to an active state, turning on dummy transfer gate 304b so that dummy capacitor 302b would be connected to bit line 300b. Sense amplifier 4 is operable, as described in said U.S. Pat. No. 4,658,377, to sense the differential stored voltage between bit lines 300a and 300b after storage capacitor 306a and dummy capacitor 302b have been connected thereto, to amplify the sensed differential voltage to a logic level for communication to input/output buffer 24 (if sense amplifier 4 is selected by Y decoder 20), and to restore the sensed logic state into storage capacitor 306a (whether or not the associated sense amplifier 4 is selected by Y decoder 20). It should be noted that said U.S. Pat. No. 4,658,377 describes a segmented folded bit line approach, where each of bit lines 300 are divided into segments, with an individual segment selected for application to sense amplifier 4 by way of additional decoding. While the advantages of the segmented approach would be equally applicable to RAM 1 described herein, the configuration of FIG. 11 does not include such segmentation of bit lines 300 for purposes of simplicity, and as the segmented approach is not essential for the operation and achievement of the advantages of the selective row write feature described herein.

For purposes of the selective row write feature described herein, transistors 320a and 320b are connected to bit lines 300a and 300b, respectively; the gates of transistors 320a and 320b are controlled by data signals F0 and F1, respectively. Transistors 320a and 320b are connected, via line 321, to one plate of capacitor 322, which has its other plate connected to ground. Transistor 324 is connected in parallel with capacitor 322, and has its gate controlled by precharge signal PC; with precharge signal PC active (occurring during the precharge portion of the memory cycle), capacitor 322 is discharged to ground. Line 321 is similarly connectable, via transistors 320, to additional bit lines 300 associated with others of sense amplifiers 4. in this way, capacitor 322 is shared by multiple pairs of bit lines 300. It is preferable that the sharing of a single capacitor 322 be limited to bit lines 300 which are associated with a single input/output of RAM 1 (i.e., within a single array 2). The selection of the data state to be applied by capacitor 322 will be further explained thereinbelow.

The selective row write feature incorporated in this embodiment is accomplished by way of overriding the charge presented by storage capacitors 306 and dummy capacitors 302 to sense amplifiers 4, so that each of sense amplifiers 4 are forced to the same data state, and restore the same data state in each of the storage capacitors 306 in the selected row. In this embodiment, this is accomplished by connecting capacitor 322 to either the bit line 300 to which the storage capacitor 306 is connected during sensing, or the opposite bit line 300 to which the dummy capacitor 302 is connected during sensing. It is of course well known that in modern dynamic RAM devices, the parasitic capacitance of a typical bit line 300 is on the order of 10 times the capacitance of a typical storage capacitor 306. Capacitor 322 is of a size sufficient to discharge either the storage capacitor 306 or dummy capacitor 302, and to partially discharge the bit line 300 to which line 321 is connected through transistors 320, to such a degree that sense amplifier 4 will be set in a known direction. For example, in the event that a selective row write is to be accomplished so that storage capacitor 306a is to be written with a "0" state, signal F0 will be active prior to sensing, to connect capacitor 322 to bit line 300a which will have the effect of discharging storage capacitor 306a and bit line 300a, regardless of the stored data in storage capacitor 306a. During sensing, sense amplifier 4 will thus operate as if storage capacitor 306a had no charge stored therein (i.e., a "0" state). In the restoring operation, sense amplifier 4 will restore a "0" state into storage capacitor 306a. This will also be occurring for each of storage capacitors 306a which are associated with word line signal XWD0, so that an entire row of RAM 1 will be written to a "0" state in a single cycle, without use of Y decoder 20 and the write circuitry in RAM 1.

Table 2 illustrates the bit line to which capacitor 322 is connected to accomplish the writing of "1" and "0" states into storage capacitors 306a and 306b on either of bit lines 300a and 300b.

TABLE 2

| Storage capacitor | Data | Active signal |
|---|---|---|
| 306a | 0 | F0 |
| 306a | 1 | F1 |
| 306b | 0 | F1 |
| 306b | 1 | F0 |

As is evident from FIG. 11, in order to write a "0" state, capacitor 322 should be connected to the bit line 300 of the selected storage capacitor 306, and in order to write a "1" state, capacitor 322 should be connected to the bit line 300 of the selected dummy capacitor.

The minimum capacitance of capacitor 322 to accomplish the above function can be easily calculated. The worst case for capacitor 322 in the selective row write operation is to write a "0" state onto the bit line 300 to which the storage capacitor 306 connected thereto is storing a full "1" level. This operation requires capacitor 322 to discharge storage capacitor 306a (for example) from a full "1" level and to further discharge its associated bit line 300a by the amount of charge stored in dummy capacitor 302b (associated with bit line 300b) in order to ensure that sense amplifier 4 will sense that storage capacitor 306a is at a "0" state, and that the "0" will be restored therein, accomplishing the write. The charge which will be presented by dummy capacitor 302b to bit line 300b will be its capacitance $C_{302}$ times the difference in the precharge voltages $V_{bit} - V_{ref}$, where $V_{bit}$ is the bit line precharge voltage and $V_{ref}$ is the dummy capacitor precharge voltage. The maximum charge which will be presented by storage capacitor 306a to bit line 300a is its capacitance $C_{306}$ times the difference between $V_{dd}$ (in the stored "1" case) and $V_{bit}$. The charge which can be stored by capacitor 322 will be its capacitance $C_{322}$ times the difference between its initial precharge voltage $V_0$ and the bit line precharge voltage $V_{bit}$ to which it will be connected by transistor 300a. Each pair of bit lines 300 may have its own capacitor 322 and precharge transistor 324 associated therewith; it is likely to be more efficient from a layout standpoint to have a single capacitor 322 and precharge transistor 324 shared by a number of pairs of bit lines 300. This of course requires that capacitor 322 be sized so as to accommodate the worst case condition occurring simultaneously for all of the associated pairs of bit lines 300 (e.g., discharging a "1" level from all selected storage capacitors 306). Accordingly, a successful selective row write operation requires that the value $C_{322}$ of capacitor 322 satisfy the following relationship:

$$C_{322}(V_{bit}-V_0) \leq n[C_{306}(V_{dd}-V_{bit})+C_{302}(V_{bit}-V_{ref})]$$

where n is the number of storage capacitors 306 selected for each row which share a single capacitor 322 (in the case there each pair of bit lines 300 has its own capacitor 322, n equals 1). This relationship is thus equivalent to requiring that the charge to be stored by capacitor 322 in such an operation must at least equal the charge stored by n storage capacitors 306a having a "1" value (relative to the precharge voltage of bit lines 300a) plus the charge stored by each of the dummy capacitors 302b (relative to the precharge voltage of bit line 300). As described above in this embodiment, however, $V_0$ is at ground, $V_{bit}$ is ½ $V_{dd}$, $C_{302}$ equals $C_{306}$, and $V_{ref}$ is ⅓ $V_{dd}$. The above relationship for defining the value of capacitor 322 may accordingly be simplified to:

$$C_{322}(V_{dd}/2) < n[C_{306}(2V_{dd}/3)]$$

and consequently to:

$$C_{322} < n[C_{306}(4/3)]$$

For a 50 fF value of capacitance for storage capacitor 306, assuming that 256 storage capacitors 306 are selected in a row of each array 2 (RAM 1 being 512 by 2048, organized into eight 512 by 256 arrays 2), the value of capacitor 322 must thus be at least approximately 17 pF. It should especially be noted that the precharging of capacitor 322 to ground provides the minimum size of capacitor 322 where the bit lines 300 are precharged to ½ $V_{dd}$.

As directed solely to the performance of the selective row write feature described herein, the size of capacitor 322 has no practical maximum value. However, it should be noted that if capacitor 322 excessively discharges the bit line 300 to which it is connected, the operation of sense amplifiers 4 which are not utilizing the selective row write feature may be adversely affected. This situation may occur in a memory constructed as RAM 1, where each of arrays 2 may independently be selected for, or inhibited from, performing the selective row write feature.

Figure 11A:
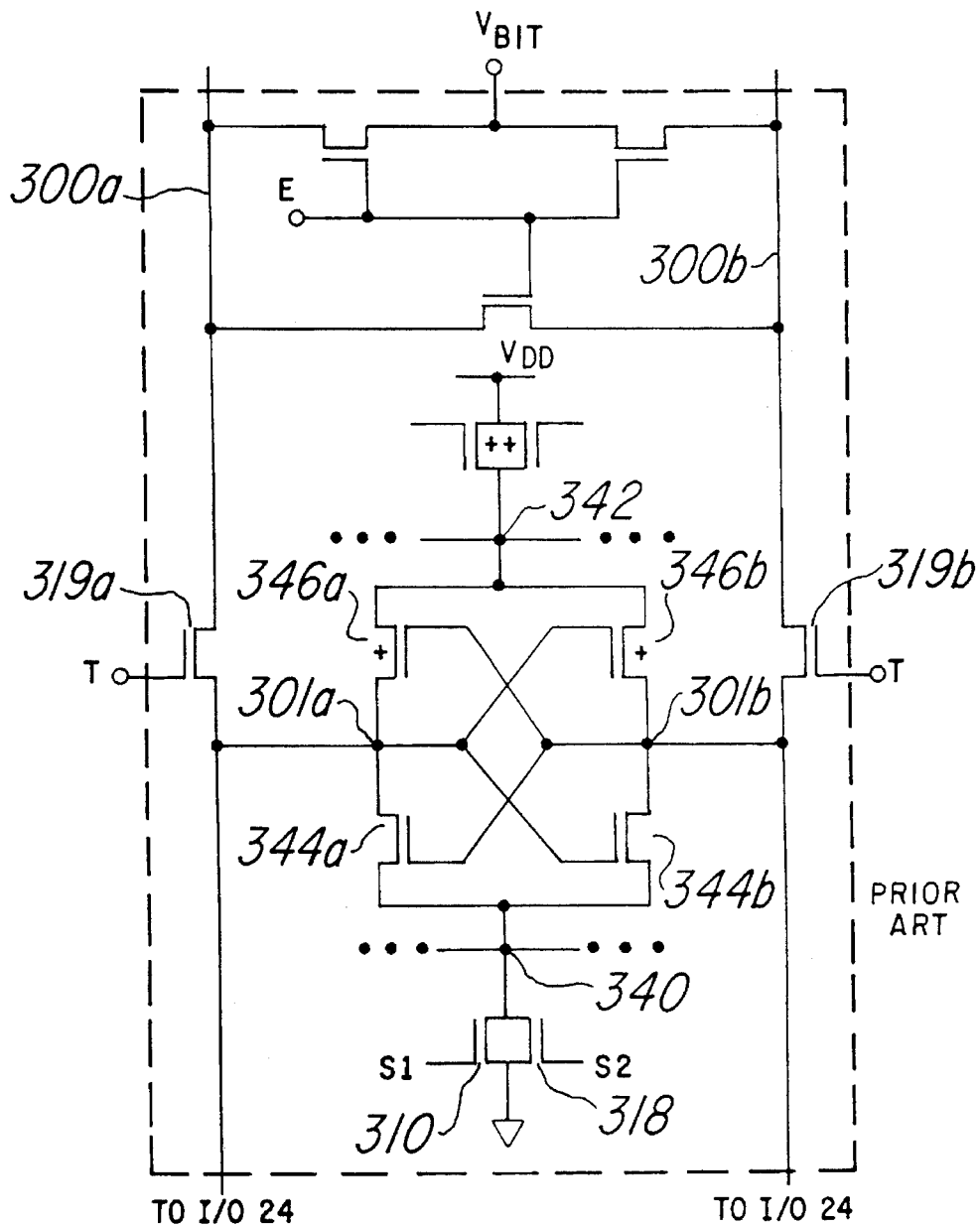
FIG. 11a is an electrical diagram, in schematic form, of a typical sense amplifier circuit of FIG. 1.

Referring to FIG. 11a, the construction of a typical CMOS sense amplifier 4 as described in said U.S. Pat. No. 4,658,377 is illustrated. Bit lines 300a and 300b are each connected, via transistors 319a and 319b, respectively, to the sensing nodes 301a and 301b at the junction between p-channel transistor 346a (or 346b, for bit line 300b) and n-channel transistor 344a (or 344b), said transistors 344 and 346 serving in the well-known cross-coupled inverter arrangement. Node 340 at the source of transistors 344 is shared among a plurality of sense amplifiers 4, as is node 342 at the source of transistors 346. During the sensing operation, prior to such time as clock S1 (clock S1 preceding clock S2) goes to a high state to begin amplification, node 340 is isolated from ground, which allows the differential voltage between bit lines 300a and 300b to stabilize prior to amplification. Also during this time, clock signal T is high, so that bit lines 300a and 300b are connected to sensing nodes 301a and 301b by transistors 319a and 319b. The stabilization of the differential voltage is useful to prevent false sensing due to noise coupled into sense amplifier 4.

If capacitor 322 in FIG. 11 is excessively large, the bit line 300 to which it is coupled may be discharged to a voltage less than the threshold voltage of n-channel transistor 344 below ½ $V_{dd}$. For example, if bit line 300a is connected to capacitor 322 and is so excessively discharge, transistor 344b will be turned off and transistor 344a may be turned on so that node 340 begins to discharge to bit line 300a through transistor 344a. While such discharge of node 340 is not harmful for the sense amplifiers 4 for which capacitor 322 is overriding the sensing application, if node 340 is shared with ones of sense amplifiers 4 for which the selective row write feature is not being utilized, the discharge of node 340 may prematurely set the state of the cross-coupled inverters therein, prior to stabilization of the bit line voltages (i.e., similarly as if clock S1 began pulling node 340 to ground prior to stabilization of the bit lines 300). Accordingly, capacitor 322 must be limited in size so that it does not pull its associated bit lines more than one threshold voltage of the transistors 344 below the bit line precharge voltage. This maximum value of capacitor 322 depends upon the characteristics of the bit lines 300 and sense amplifiers 4 in each particular RAM 1, and may be easily calculated by one of ordinary skill in the art.

Figure 12:
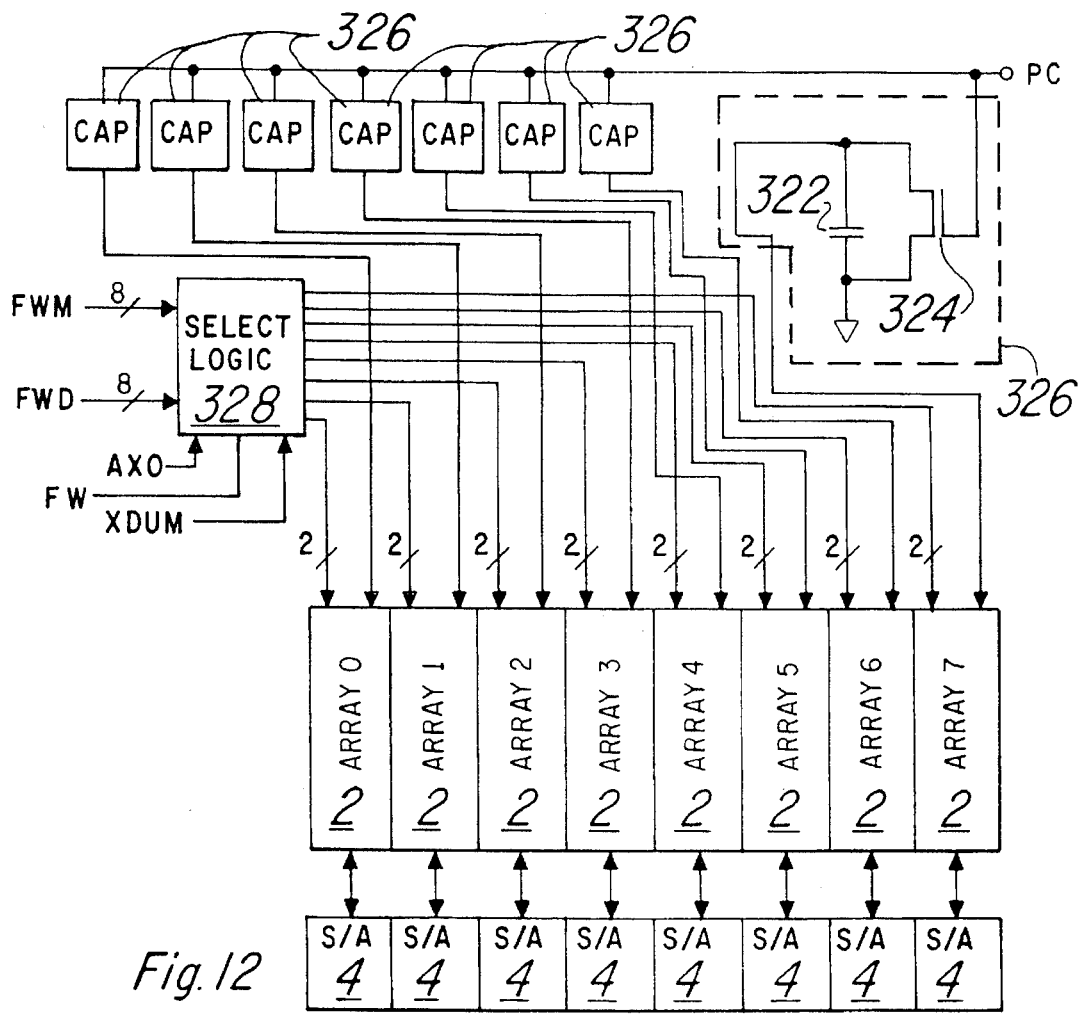
FIG. 12 is an electrical diagram, in block form, of the incorporation of the circuitry of FIG. 11 into a memory utilizing the selective row write feature.

FIG. 12 illustrates, in block form, the configuration of capacitors 322 into RAM 1, as associated with each of arrays 2. In FIG. 12, certain of the functional blocks of FIG. 1 are not shown for purposes of clarity. Each of arrays $2_0$ through $2_7$ have an associated capacitor 322 and transistor 324, as described above in FIG. 11 (shown in FIG. 12 in the aggregate by block 326). It should be noted that a single capacitor 322 and a single transistor 324 could be shared lay all of arrays 2. Select logic 328 receives lines FWM from write mask register 54, and lines FWD from color register 50, shown in FIG. 2. Signal XDUM is used in RAM 1 to generate signals DUM0 and DUM1 of FIG. 11 which connect the selected one of dummy capacitors 302 to its associated bit line 300 at the proper time. Line AX0 is the least significant bit of the row address, and is utilized in conjunction with the data to be written by way of tile selective row write feature according to Table 1. Select logic 328 further receives signal FW from combinational logic 44, which enables the selective row write feature according to the state of the control inputs according to Table 1 hereinabove. Two lines are output from select logic 328 to each of arrays. 2, such two lines being lines F0 and F1 shown in FIG. 11 for selecting for each pair of bit, lines 300 in the array which, if either, of bit lines 300a and 300b capacitator 322 is to be connected. As is evident from FIG. 12, the application of capacitor 322 is separately controllable for each of arrays 2, with the selective row write feature inhibited according to the information stored in write mask register and with the data state controllable for each of arrays 2 by way of the information stored in color register 50.

Figure 13:
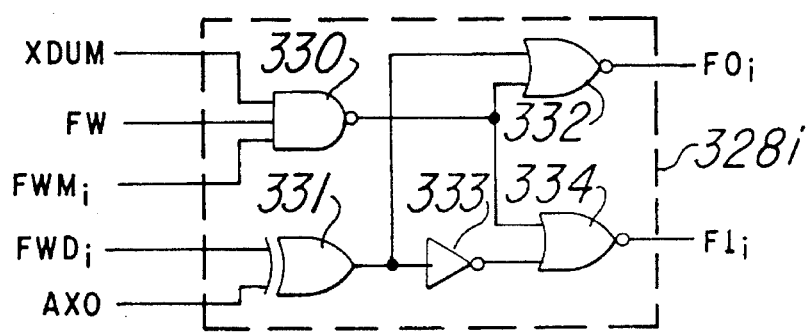
FIG. 13 is an electrical diagram, in schematic form, of logic for selecting the data state to be written in the selective row write feature.

Referring now to FIG. 13, the construction and operation of select logic 328 incorporated into RAM 1 in determining the one of the pair of bit lines 300 to which capacitor 322 will be connected, and the incorporation of write mask information from write mask register 54 into the selective row write feature, will be described. The portion of select logic $328_i$ shown in FIG. 13 is that associated with one array $2_i$ of arrays $2_0$ through $2_7$ of FIGS. 1 and 12; logic $328_i$ is of course repeated eight times for each, of the eight arrays 2 in RAM 1. Select logic $328_i$ of FIG. 13 is thus associated with a single capacitor 322 (and accompanying transistor 324), dedicated in this embodiment to one of arrays 2.

NAND gate 330 receives the signal on line FW from combinational logic 44 of FIGS. 2 and 4; an active signal on line FW indicates that a selective row write operation has been selected, according to the data states received by terminals WE_, SF and TR_ at the RAS_ transition. NAND gate 330 further receives a signal $FWM_i$ from write mask register 54; the logic of FIG. 13 is associated with one of arrays 2 (namely array $2_i$), and therefore receives the corresponding bit i of write mask register 54. The write mask feature, by which the write operation may be inhibited for selected arrays 2, is thus incorporated into the selective row write feature described herein. Of course, the application of the write mask information as shown in FIG. 13 is not essential to the operation of the selective row write feature, but is an advantageous alternative if so applied. NAND gate 330 further receives at an input timing signal XDUM described above. In this way, the application of signals $F0_i$ or $F1_i$, as the case may be, will occur at the proper time in the memory cycle. The output of NAND gate 330 is thus at a low logic level only in the event that line FW is enabled (i.e., the selective row write feature is selected), line $FWM_i$ is at a high state ( i.e., write is not inhibited for array $2_i$), and line XDUM is high at the proper time in the cycle.

The selection of signals $F0_i$ and $F1_i$ for array $2_i$ is also accomplished by the logic of FIG. 13. Exclusive OR gate 331 receives the least significant row address bit AX0 at one input, bit AX0 selecting whether word line XWD0 or word line XWDI is to be asserted (assuming that the more significant bits of the row address are selecting one of the word line pairs). Exclusive OR gate 331 also receives line $FWD_i$ from color register 50. Line $FWD_i$ carries the data bit to be written into the selected row of array i. While the data source for the selective row write feature is illustrated herein as color register 50, it should also be apparent that the data input terminals could similarly present the data to be written therein. Since the selective row write feature is directed to the clearing and filling of a portion of the memory stored in RAM 1, it is useful to present the same data to a plurality of rows therein. The use of color register 50 as the source for the data to be used in the selective row write feature is preferable in such an application, since it relieves the user from presenting the same input data repeatedly to the data terminals D0 through D7.

The output of exclusive OR gate 331 is connected to an input of NOR gate 332 and, via inverter 333, to an input of NOR gate 334. NOR gate 332 receives the output of NAND gate 330 at its other input, and drives line $F0_i$ at its output. Similarly, NOR gate 334 receives the output of NAND gate 330 at its other input, and drives line $F1_i$ at its output. The output of NAND gate 330 therefore serves as an enable signal, as the outputs of NOR gate 332 and 334 are unconditionally low when the output of NAND gate 330 is high. With the output of NAND gate 330 low, during an unmasked selective row write operation, the output of either of NOR gate 332 or NOR gate 334 will be high (with the output of the other NOR gate 332 or 334 driven low), responsive to the output of exclusive OR gate 331 which performs the selection described in Table 2 above. Either line $F0_i$ or line $F1_i$ will be driven to its high state, depending upon the input data and the row selection, to connect capacitor 322 to bit line 300a or 300b, is necessary to accomplish the desired operation.

Figure 14:
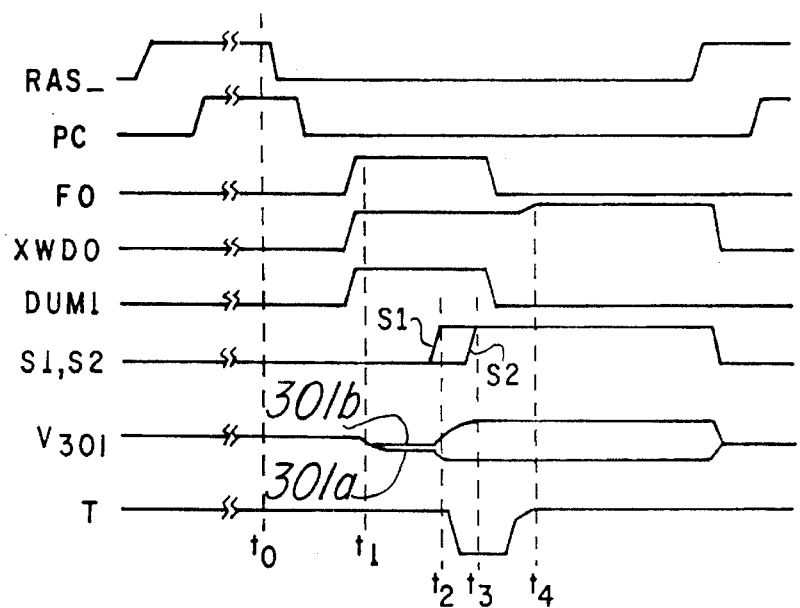
FIG. 14 is a timing diagram illustrating the operation of the selective row write feature.

Referring now to FIG. 14 in conjunction with FIGS. 11 and 11a, the timing of the operation of the selective row write function for an array 2 of RAM 1 will be described. At $t_0$, RAM 1 is in the precharge portion of the memory cycle (following the prior-active cycle). Clock signal T is high, so bit lines 300a and 300b are connected to sensing nodes 301a and 301b of sense amplifier 4. At this time, bit lines 300 are being precharged by sense amplifier 4 to $V_{bit}$, at approximately ½ $V_{dd}$; the voltages of sensing nodes 301a and 301b (indicative of the voltages of their corresponding bit lines 300a and 300b while clock signal T is high) are illustrated on line $V_{301}$ in FIG. 14. Also at this time, capacitor 322 is being precharged to $V_{ss}$ and dummy capacitors 302a and 302b are being precharged to $V_{ref}$ (at approximately ⅓ $V_{dd}$).

Subsequent to $t_0$, line RAS__ makes a high-to-low transition at the beginning of the next active memory cycle. It is assumed for purposes of this example in FIG. 14 that the selective row write feature is being selected, and that a logic "0" is to be written into storage capacitor 306a of FIG. 11. At some time (shown as time $t_1$ in FIG. 14) after the row address has been latched and decoded by X decoder 18, line F0 will be driven to a high state by select logic 328 for the array 2 under considerations (for a logic "0" is to be written into storage capacitor 306a (in an even-numbered row). As described above, this will cause transistor 320a to connect-capacitor 322 to bit line 300a. Also at approximately this time, line DUM1 will be driven to a high logic state, so that dummy transfer gate 304b will connect dummy capacitor 302b to bit line 300b, and line XWD0 will be driven high so that transfer gate 308a will connect storage capacitor 306a to bit line 300a. Conversely, lines XWD1 and DUM0 will be held at a low level, isolating storage capacitor 306b and dummy capacitor 302a from bit lines 300b and 300a, respectively. The connection of dummy capacitor 302b to bit line 300b will cause the voltage of bit line 300b to be reduced a slight amount at this time, since dummy capacitor 302b is charged to a voltage less than that to which bit line 300b is charged. Since capacitor 322 is connected to bit line 300a, capacitor 322 will pull charge from bit line 300a and from storage capacitor 306a, pulling the voltage level of bit line 300a below the voltage of bit line 300b after time $t_1$. This is shown in FIG. 14 by the voltage of sensing node 301a being below the voltage of sensing node 301b after time $t_1$.

It should be noted that it may be preferable to connect capacitor 322 to bit line 300a or bit line 300b, as the case may be, prior to such time as the word line (XWD0, XWD1) and dummy word lines (DUM0, DUM1) are activated. Since the bit lines 300 are precharged so as to be storing substantial charge, the early connection of capacitor 322 can pull its associated bit line 300 to a low voltage prior to the connection of storage capacitor 306 or dummy capacitor 302 thereto. Such early connection may minimize noise effects caused by the connection of multiple capacitive elements to bit lines 300. However, it is only necessary that capacitor 322 be connected to bit line 300a (in this example) for sufficient time to discharge the bit line 300a to a stable voltage prior to the amplification of the differential voltage by sense amplifier 4.

At time $t_2$, clock signal S1 goes active, beginning the amplification stage of the cycle. As described in said U.S. Pat. No. 4,658,377, the activation of transistor 310 by clock signal S1 turns on transistor 310, having a relatively high impedance to its parallel transistor 318, to slowly begin the separation of the voltages of sensing nodes 301a and 301b by the action of the cross-coupled inverters. Subsequent to the separation of the sensing node voltages, clock signal T goes low, isolating the capacitive loading of bit lines 300a and 300b (as well as capacitor 322) from the amplification operation by turning off transistors 319d and 319b. Clock signal S2 then goes to a high state at time $t_3$, allowing node 340 to be quickly pulled to ground, and quickly completing the amplification process during such time as bit lines 300a and 300b are decoupled from sensing nodes 301a and 301b.

After such time as the differential voltage at sensing nodes 301a and 301b is amplified (the voltage of sensing node 301a being close to $V_{ss}$, and the voltage of sensing node 301b being close to $V_{dd}$), dummy word line signal DUM1 may go to a low state, as the sensing operation is complete and no further assistance from dummy capacitor 302b is required. Signal XDUM has gone low by this time, inactivating line F0 (and line DUM1) so that the restoring of storage capacitor 306a is not loaded by capacitor 322. The restoring operation begins by clock T going to a high level, turning on transistors 319a and 319b so that the amplified voltages at sensing nodes 301a and 301b can be applied to bit lines 300a and 300b, charging storage capacitor 306a (in this case) to a "0" state. At time $t_4$ shown in FIG. 14, word line XWD0 and clock signal T are boosted to d voltage above $V_{dd}$, by techniques well known in the art, so that if a "1" level were being written, no threshold voltage drop would occur across transfer gate 304a and transistor 319a. However, since capacitor 322 has discharged bit line 300a to a low level during the sensing period, a "0" level will be "restored" by sense amplifier 4 into storage capacitor 306a at this time. The memory cycle ends with the deactivation of signals S1, S2 and XWD0, with the precharge and equalization operation beginning thereafter.

The selective row write feature described herein is most likely an alternative to the block write feature described above relative to FIGS. 7 through 9, as either can be used to efficiently perform a clear or fill operation when RAM 1 is utilized for image storage. However, the two features are not necessarily exclusive of one another, and both may be incorporated into the same RAM 1 if so desired.

Although the invention has been described with reference to an illustrative embodiment, it is to be understood that this description is by way of example only, and is not intended to be construed in a limiting sense. It is to be further understood that numerous changes in the details of the illustrative embodiment, and additional embodiments of the invention, will be apparent to, and may be made by, persons skilled in the art having reference to this description. In addition, it is to be further understood that those skilled in the art may readily substitute present and future equivalent components for those described herein, in order to achieve the same result as the illustrative embodiment. It is contemplated that such changes, substitutions and additional embodiments are within the spirit and scope of the invention as hereinafter claimed.

I claim:

1. A memory device comprising:

an array of memory cells arranged in addressable rows and columns;

the memory device receiving row addresses, column addresses, control signals and data representing an image for display;

logic apparatus responsive to the control signals for generating a selected control signal;

a row decoder, responsive to individual ones of the row addresses, for selecting a selected row of the array of memory cells; and a column decoder, responsive to individual ones of the column addresses and the selected control signal, for selecting either a single column of the array of memory cells or a plurality of columns of the array of memory cells for writing the data representing the image, the data being simultaneously written into the plurality of columns of the array of memory cells.

2. The memory device, in accordance with claim 1, further comprising:

a color register;

a data bus for applying the data representing the image to the color register; and a multiplexer, responsive to the selected control signal, for selecting the data from the color register, that data being simultaneously written into a plurality of memory cells in the selected row of the array.

3. The memory device, in accordance with claim 2, further comprising:

a mask register;

the data bus for also applying data to the mask register for storage; and a circuit for writing a portion of the data, stored in the color register and masked by the data stored in the mask register, simultaneously to a plurality of memory cells in the selected row of the memory array.

4. The memory device, in accordance with claim 3, wherein:

the writing circuit writes a portion of plural different data, masked by the first data stored in the mask register, to a plurality of memory cells in different selected rows of the memory array during plural memory cycles.

5. The memory device, in accordance with claim 1, further comprising:

a mask register;

the bus applying first data to the mask register for storage; and a circuit for writing a portion of second data, masked by the first data stored in the mask register, simultaneously to a plurality of memory cells in the selected row of the memory array.

6. The memory device, in accordance with claim 5, wherein:

the writing circuit writes a portion of plural different data, masked by the first data stored in the mask register, to a plurality of the memory cells in different selected rows of the memory array during plural memory cycles.

7. A data processing system comprising:

a central processing unit generating row address signals, column address signals, and control signals; and a memory device comprising:

an array of memory cells arranged in addressable rows and columns;

the memory device receiving the row addresses, column addresses, control signals and data representing an image for display;

logic apparatus responsive to the control signals for generating a selected control signal;

a row decoder, responsive to individual ones of the row addresses, for selecting a selected row of the array of memory cells; and a column decoder, responsive to individual ones of the column addresses and the selected control signal, for selecting either a single column of the array of memory cells or a plurality of columns of the array of memory cells for writing the data representing the image, the data being simultaneously written into the plurality of columns of the array of memory cells.

* * * * *

UNITED STATES PATENT AND TRADEMARK OFFICE
CERTIFICATE OF CORRECTION

PATENT NO. : 5,528,551
DATED : June 18, 1996
INVENTOR(S) : Raymond Pinkham

It is certified that error appears in the above-indentified patent and that said Letters Patent is hereby corrected as shown below:

On title page, item [73]
    Assignee: Texas Instruments Incorporated  Dallas, Texas Signed and Sealed this Seventeenth Day of September, 1996

Attest:

BRUCE LEHMAN

Attesting Officer     Commissioner of Patents and Trademarks